(12) United States Patent
Kanegae

(10) Patent No.: US 8,558,445 B2
(45) Date of Patent: *Oct. 15, 2013

(54) EL DISPLAY PANEL, EL DISPLAY APPARATUS, AND METHOD OF MANUFACTURING EL DISPLAY PANEL

(75) Inventor: Arinobu Kanegae, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/594,035

(22) Filed: Aug. 24, 2012

(65) Prior Publication Data

US 2012/0319117 A1    Dec. 20, 2012

Related U.S. Application Data

(63) Continuation of application No. 13/281,891, filed on Oct. 26, 2011, now Pat. No. 8,274,207, which is a continuation of application No. PCT/JP2010/005846, filed on Sep. 29, 2010.

(51) Int. Cl.
*H05B 33/00* (2006.01)
*H01J 9/00* (2006.01)

(52) U.S. Cl.
USPC .......................................... 313/498; 313/506

(58) Field of Classification Search
None
See application file for complete search history.

(56) References Cited

U.S. PATENT DOCUMENTS

| | | |
|---|---|---|
| 5,529,951 A | 6/1996 | Noguchi et al. |
| 5,869,803 A | 2/1999 | Noguchi et al. |
| 6,071,765 A | 6/2000 | Noguchi et al. |
| 6,538,374 B2 | 3/2003 | Hosokawa |
| 7,227,306 B2 | 6/2007 | Park et al. |
| 7,456,811 B2 | 11/2008 | Kwak |
| 7,768,485 B2 | 8/2010 | Uchino et al. |
| 2005/0179374 A1 | 8/2005 | Kwak |
| 2005/0218819 A1 | 10/2005 | Eida |
| 2006/0267491 A1 | 11/2006 | Koo et al. |
| 2007/0200112 A1* | 8/2007 | Yamazaki et al. .............. 257/72 |

(Continued)

FOREIGN PATENT DOCUMENTS

| | | |
|---|---|---|
| JP | 7-235490 | 9/1995 |
| JP | 2000-221907 | 8/2000 |

(Continued)

OTHER PUBLICATIONS

U.S. Appl. No. 13/281,841 to Arinobu Kanegae, which was filed on Oct. 26, 2011.

(Continued)

*Primary Examiner* — Ashok Patel
(74) *Attorney, Agent, or Firm* — Greenblum & Bernstein, P.L.C.

(57) ABSTRACT

A light-emitting panel includes a thin film semiconductor that includes a thin film transistor. The thin film transistor includes a gate electrode, a semiconductor layer above the gate electrode, a gate insulating film between the gate electrode and the semiconductor layer, a first electrode electrically connected to the semiconductor layer, and a second electrode. A first interlayer insulating film is above the thin film semiconductor. A gate line and an auxiliary line are above the first interlayer insulating film and between the first interlayer insulating film and a second interlayer insulating film. The gate line is electrically connected to the gate electrode. An electroluminescence emitter includes two electrodes and a light-emitting layer between the two electrodes. One of the two electrodes is connected to the auxiliary line.

9 Claims, 27 Drawing Sheets

(56) References Cited

U.S. PATENT DOCUMENTS

| | | |
|---|---|---|
| 2007/0268210 A1 | 11/2007 | Uchino et al. |
| 2008/0272992 A1 | 11/2008 | Kwak |
| 2009/0091257 A1* | 4/2009 | Yoshinaga .................. 313/505 |
| 2009/0134399 A1 | 5/2009 | Sakakura et al. |
| 2010/0013384 A1 | 1/2010 | Song et al. |
| 2010/0188384 A1 | 7/2010 | Uchino et al. |

FOREIGN PATENT DOCUMENTS

| | | |
|---|---|---|
| JP | 2000-223279 | 8/2000 |
| JP | 2003-108033 | 4/2003 |
| JP | 2003-108068 | 4/2003 |
| JP | 2005-227788 | 8/2005 |
| JP | 2006-011059 | 1/2006 |
| JP | 2006-184384 | 7/2006 |
| JP | 2006-343504 | 12/2006 |
| JP | 2007-047808 | 2/2007 |
| JP | 2007-310311 | 11/2007 |
| JP | 2010-003880 | 1/2010 |
| JP | 2010-085866 | 4/2010 |
| JP | 2010-212328 | 9/2010 |

OTHER PUBLICATIONS

International Search Report in PCT/JP2010/005846, dated Nov. 2, 2011.

* cited by examiner

EL DISPLAY PANEL, EL DISPLAY APPARATUS, AND METHOD OF MANUFACTURING EL DISPLAY PANEL

CROSS REFERENCE TO RELATED APPLICATIONS

The present application is a continuation application of U.S. patent application Ser. No. 13/281,691, filed on Oct. 26, 2011, which is a continuation application of PCT Application No. PCT/JP2010/005846, filed on Sep. 29, 2010, designating the United States of America. The disclosure of each of these documents, including the specification, drawings, and claims, is incorporated herein by reference in its entirety.

BACKGROUND OF THE INVENTION (1) Field of the Invention

The present invention relates to thin film semiconductor devices and EL display panels using the thin film semiconductor devices and methods of manufacturing EL display apparatuses and EL display panels, and particularly relates to a thin film semiconductor device used for an active-matrix display apparatus and a method of manufacturing the same.

(2) Description of the Related Art

Thin film transistors (TFT) are used as a switching device for selecting pixel or a driving device for display device in active-matrix drive display apparatuses such as liquid crystal display apparatuses and organic EL display apparatuses.

TFTs are used for active-matrix substrate of display apparatuses, and active research and development have been done for improving the capability. In particular, along with the increase in the size and increased definition of display apparatus, there is a demand for high driving capability TFT. In this context, semiconductor thin films (polysilicon and microcrystalline silicon) crystallized for channel layers (active layers) have been attracting attention.

As a crystallizing process of a semiconductor thin film, instead of the conventional high temperature process technology in which a treatment temperature of 1000 degrees Celsius or higher is used, a low temperature process utilizing a treatment temperature of 600 degrees Celsius or lower has developed. In the low temperature process, it is not necessary to use expensive substrate such as highly heat resistant quartz, which reduces manufacturing cost.

Laser annealing which uses laser beam for heating has attracted attention as a type of low temperature process. Laser annealing includes locally heating and melting, by irradiating laser beam, non-single crystal semiconductor thin film such as amorphous silicon laminated on an insulating substrate with low heat resistance such as glass, and crystallizing the semiconductor thin film during the cooling process. Mobility of carriers in the crystallized semiconductor thin film increases, improving capability of the thin film transistor (for example, see Patent Literature 1: Japanese Unexamined Patent Application Publication No. H07-235490).

Majority of thin film transistors have a bottom-gate structure in which gate electrodes are arranged in a level lower than the channel layer. The following describes a conventional bottom-gate thin film transistor with reference to FIGS. 25, 26A to 26C, and 27. FIG. 25 is a planar view of the conventional thin film semiconductor device for display apparatus corresponding to one pixel of the display apparatus. FIG. 26A is a cross-sectional view of the conventional thin film semiconductor device for display apparatus along the line X1-X1' in FIG. 25. FIG. 26B is a cross-sectional view of the conventional thin film semiconductor device for display apparatus along the line X2-X2' in FIG. 25. FIG. 26C is a cross-sectional view of the conventional thin film semiconductor device for display apparatus along the line Y-Y' in FIG. 25. FIG. 27 is a perspective view corresponding to FIG. 26A, illustrating major components of the conventional thin film semiconductor device for display apparatus from the cross section X1-X1' in FIG. 25.

As illustrated in FIGS. 25, 26A to 26C, and 27, the conventional thin film semiconductor device for display apparatus 9 includes a gate line 921 formed along the row direction (horizontal direction) of the pixel, a source line 922 formed along the column direction (vertical direction) of the pixel, and a thin film transistor 910 arranged at a position in which the gate line 921 and the source line 922 cross each other.

As illustrated in FIG. 26A, the thin film transistor 910 is a bottom-gate thin film transistor, and is a multilayer structure including a gate electrode 910G, a gate insulating film 930, a semiconductor layer (channel layer) 911, and one pair of source electrode 910S and a drain electrode 910D sequentially formed on a substrate 900.

As illustrated in FIGS. 25 and 26A, the gate electrode 910G extends from the gate line 921, and formed in a first metal layer ML1' in which the gate line 921 is also formed. The gate insulating film 930 is formed on the substrate 900 to cover the gate line 921 and the gate electrode 910G. The semiconductor layer 911 is formed on the gate insulating film 930 in an island shape overlapping the gate electrode 910G. The source electrode 910S and the drain electrode 910D is formed overlapping part of the semiconductor layer 911 and arranged separately opposite to each other. The source electrode 910S and the drain electrode 910D are formed in a second metal layer ML2', in which the source line 922 is also formed. Note that, an interlayer insulating film 940 is laminated covering the thin film transistor 910, the gate line 921, and the source line 922.

Here, when forming the semiconductor layer 911 in the bottom-gate thin film transistor 910 by forming amorphous silicon on the gate electrode 910G and crystallizing the amorphous silicon by laser annealing, the heat of laser annealing radiates through the gate electrode 910G when melting the amorphous silicon. Accordingly, it is preferable that the gate electrode 910G is made of a material with small heat conductivity for suppressing the radiation of the heat at the time of laser annealing.

In the gate line 921, high line resistivity causes delay in signals or uneven display brightness of the display apparatus due to voltage drop. Particularly, increased driving frequency due to increased panel dimension of the display apparatus makes the panel more likely to be affected by the line resistance. Therefore, it is preferable that the gate line 921 is composed of the material with low resistivity (specific resistance).

As described above, the gate electrode 910G and the gate line 921 are formed in the same layer. Thus, they are usually made of the same material. Thus, when the gate electrode 910G is made of the material with small heat conductivity in consideration of crystallizing the semiconductor layer 911, the gate line 921 is also made of the material with small heat conductivity. Alternatively, when the gate line 921 is made of the material with small resistivity in consideration of the line resistance of the gate line 921, the gate electrode 910G is also made of the material with small resistivity.

However, most of metal with small heat conductivity has high resistivity. Thus, it is difficult to satisfy both the concern in crystallizing the semiconductor layer 911 and the concern in line resistance of the gate line 921 at the same time.

In order to address this problem, the thin film semiconductor device for display apparatus which solves these concerns at the same time has been proposed (see Patent Literature 2: Japanese Unexamined Patent Application Publication No. 2007-047808). Patent Literature 2 discloses a structure in which the gate line is divided into two portions for satisfying both the heat conductivity of the gate electrode and reduced resistance in the gate line.

More specifically, in the thin film semiconductor device for display apparatus according to Patent Literature 2, the gate line includes an integral portion integrally formed with the gate electrode and a separate portion connected to the integral portion through a contact hole. In addition, the integrated portion of the gate line three-dimensionally crosses the source line interposing the gate insulating film in between. The integrated portion of the gate electrode and the gate line are made of material with lower heat conductivity than the separate portion of the gate line. Meanwhile, the separate portion of the gate line is made of material with lower resistivity than the gate electrode.

SUMMARY OF THE INVENTION

However, in the thin film semiconductor device for display apparatus disclosed in Patent Literature 2, the integrated portion of the gate electrode and the gate line are still made of the same material. Accordingly, forming the gate electrode with the material having small heat conductivity increases the resistivity of the material composing the integrated portion of the gate line, increasing the resistance of the integrated portion of the gate line. As a result, there is a problem that the line resistance of the gate line is not sufficiently reduced, causing uneven brightness of light emitted from the display apparatus.

Furthermore, the integrated portion and the separate portion of the gate line are connected by two contact holes for each pixel. This causes an IR drop (voltage drop due to a product of the current I and the resistance R on the line) at the connecting portion of the integrated portion and the separate portion. In addition, the gate line for one line is alternately connected to the integrated portion and the separate portion. Thus, there is a problem that even one bad connection in the connected portion of the integrated portion and the separate portion results in disconnection of all of the pixels in one line along the gate line.

In addition, the interval between the gate electrode and the drain electrode is determined by the thickness of the gate insulating film. The thickness of the gate insulating film is, for example, approximately 200 nm. When the gate electrode extends from the gate line provided in the same layer as the gate electrode and the drain electrode extends from the power supply line provided in the same layer as the drain electrode, the interval between the gate line and the drain line is approximately 200 nm, which is the thickness of the gate insulating film, in the same manner as the interval between the gate electrode and the drain electrode. Thus, in an area where the gate line and the power supply line cross each other, the interval between the gate line and the power supply line is narrow, which increases parasitic capacitance between the gate line and the power supply line. This parasitic capacitance may cause unevenness in the brightness of light emitted from the display apparatus. In addition, there is a limit in an attempt to increase the thickness of the gate insulating film to reduce the parasitic capacitance. The limit is set to secure the capability of the thin film semiconductor device, and the thickness of the gate insulating film cannot be increased beyond the limit.

Furthermore, for example, in the case of the EL display apparatus, the EL auxiliary power supply line for supplying power supply to the EL unit with the light-emitting layer. There is a problem that the EL power supply line reduces the aperture ratio of the panel of the display apparatus, and consequently, the life of the EL display apparatus is not sufficient.

In addition, the power supply lines for multiple pixels are provided for each pixel. As a result, the space for arranging the lines limits the space for arranging the thin film transistors.

The present invention has been conceived to solve the problems above, and it is an object of the present invention to provide an EL display panel which is capable of preventing uneven brightness in the emitted light and extending the product life, and in which the region for arranging thin film transistors is not limited by the space for lines.

The EL display panel according an aspect of the present invention is an Electro Luminescence (EL) display panel including: an EL unit; and a thin film semiconductor unit which controls luminescence at the EL unit, in which the EL unit includes: an anode electrode; a cathode electrode; and a light-emitting layer interposed between the anode electrode and the cathode electrode, the thin film semiconductor unit includes: a substrate; a gate electrode formed above the substrate; a gate insulating film formed above the substrate to cover the gate electrode; a semiconductor layer formed on the gate insulating film and above the gate electrode; a first electrode formed above the semiconductor layer; a second electrode formed in a same layer as the first electrode; an interlayer insulating film formed (i) above the gate insulating film to cover the first electrode and the second electrode, and (ii) in a layer different from a layer in which the gate electrode is formed; a gate line formed above the interlayer insulating film; a power supply line formed above the interlayer insulating film on which the gate line is formed, in a same layer as the gate line, and side-by-side with the gate line; and an auxiliary line formed above the interlayer insulating film, in a same layer as the gate line and the power supply line, and side-by-side with the gate line and the power supply line, and the gate electrode and the gate line are electrically connected via a first conductive portion passing through the gate insulating film and the interlayer insulating film, one of the first electrode and the second electrode is electrically connected to the power supply line via a second conductive portion passing through the interlayer insulating film, and the auxiliary line is electrically connected to the cathode electrode.

According to the EL display panel of the present invention, the gate lines and the gate electrodes can be formed in different layers. Thus, it is possible to select materials suitable for the gate lines and gate electrodes separately to reduce the line resistance and improve the brightness of the light emitted from the EL display panel.

In addition, the power supply line as the TFT power supply line is formed in the same layer as the gate lines, and thus it is possible to reduce parasitic capacitance between the power supply line and the gate line. Furthermore, since the auxiliary line as the EL power supply line is formed in the same layer as the gate line, it is not necessary to form a separate auxiliary line in the EL unit. This increases the aperture ratio of the pixels, thereby increasing the life of the display panel.

Furthermore, since the power supply line and the auxiliary line are formed in the same layer as the gate line and side-by-side with the gate line. Thus, it is possible to reduce the unevenness caused by the gate line on the interlayer insulating film by the power supply line and the auxiliary line. With this, it is possible to improve the flatness, and increase the life of the EL display panel.

Furthermore, the power supply lines shared by pixels are provided, thereby reducing the space for arranging the power supply line which used to be provided for each pixel. Therefore, it is possible to provide an EL display panel in which the space for arranging the thin film transistors is not limited by the space for the lines.

FURTHER INFORMATION ABOUT TECHNICAL BACKGROUND TO THIS APPLICATION

The disclosure of PCT application No. PCT/JP2010/005846 filed on Sep. 29, 2010, including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

Figure 1:
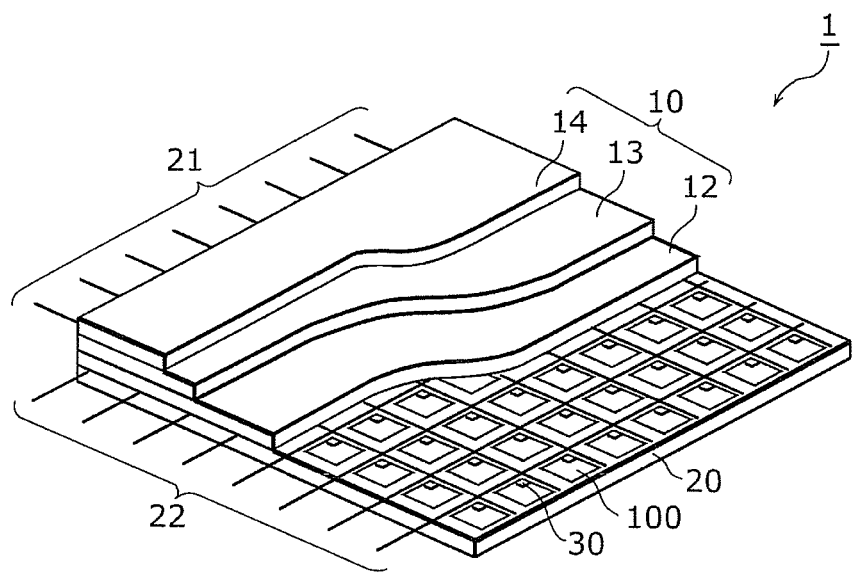
FIG. 1 is a partial cutout perspective view of an EL display panel according to the first embodiment of the present invention.

An aspect of the EL display panel according to the present invention an Electro Luminescence (EL) display panel including: an EL unit; and a thin film semiconductor unit which controls luminescence at the EL unit, in which the EL unit includes: an anode electrode; a cathode electrode; and a light-emitting layer interposed between the anode electrode and the cathode electrode, the thin film semiconductor unit includes: a substrate; a gate electrode formed above the substrate; a gate insulating film formed above the substrate to cover the gate electrode; a semiconductor layer formed on the gate insulating film and above the gate electrode; a first electrode formed above the semiconductor layer; a second electrode formed in a same layer as the first electrode; an interlayer insulating film formed (i) above the gate insulating film to cover the first electrode and the second electrode, and (ii) in a layer different from a layer in which the gate electrode is formed; a gate line formed above the interlayer insulating film; a power supply line formed above the interlayer insulating film on which the gate line is formed, in a same layer as the gate line, and side-by-side with the gate line; and an auxiliary line formed above the interlayer insulating film, in a same layer as the gate line and the power supply line, and side-by-side with the gate line and the power supply line, and the gate electrode and the gate line are electrically connected via a first conductive portion passing through the gate insulating film and the interlayer insulating film, one of the first electrode and the second electrode is electrically connected to the power supply line via a second conductive portion passing through the interlayer insulating film, and the auxiliary line is electrically connected to the cathode electrode.

According to this aspect, the gate line and the power supply line are arranged above the interlayer insulating film which does not affect the characteristics of the thin film semiconductor unit, instead of interposing the gate insulating film which affects the characteristics of the thin film semiconductor unit in the EL display panel. Thus, it is possible to prevent the parasitic capacitance between the gate line and the power supply line caused by the limitation in design that the thickness of the gate insulating film cannot be increased.

In addition, the gate line and the power supply line are arranged in a layer different from the layer in which the gate electrode, the first electrode, and the second electrode are provided. Thus, it is possible to arrange the gate line and the power supply line in parallel above the interlayer insulating film. Thus, the gate line and the power supply line are arranged in the same layer above the interlayer insulating film. Therefore, there is no cross point of the gate line and the power supply line. Consequently, it is possible to completely prevent the parasitic capacitance due to the area in which the gate line and the power supply line cross from being generated.

Furthermore, according to this embodiment, the auxiliary line (EL power supply line) for preventing voltage drop that occurs in the central region of the display screen as the size of the EL display panel increases is provided in the thin film semiconductor unit, instead of the EL unit. Furthermore, the auxiliary line is arranged side-by-side with the gate line and the power supply line on an upper surface of the interlayer insulating film which is above the thin film semiconductor. With this, it is possible to effectively use the existing layer used for arranging the gate line and the power supply line to arrange the auxiliary line. As such, by moving the auxiliary line arranged in the EL unit to the existing layer in the thin film semiconductor unit, it is possible to open up the space conventionally used for arranging the auxiliary line in the EL unit without narrowing the thin film semiconductor unit. Therefore, it is possible to increase the flexibility in design of the EL unit, and to increase the aperture ratio of each pixel included in the EL unit.

Furthermore, according to this aspect, the power supply line and the auxiliary line are formed in the same layer as the gate line and are arranged side-by-side with the gate line, thereby reducing the unevenness above the interlayer insulating film due to the gate line by the power supply line and the auxiliary line. With this, it is possible to improve the flatness, and increase the life of the EL display panel.

Furthermore, according to this aspect, common power supply lines may be arranged above the interlayer insulating film for supplying power to pixels in red, green, and blue from the common power supply line, for example. Thus, it is not necessary for arrange power supply line for each pixel in red, green, and blue, and the space for arranging power supply line for red, green, and blue pixels can be reduced, for example. Therefore, it is possible to provide an EL display panel in which the flexibility in designing transistor increases, and the space for arranging the transistors are not limited by the space for the lines.

Furthermore, in an aspect of the EL display panel according to the present invention, it is preferable that the power supply line and the auxiliary line are formed at a level identical to or within a predetermined approximate value from the gate line.

According to this aspect, it is possible to further reduce the unevenness caused by the gate line above the interlayer insulating film. With this, it is possible to improve the flatness, and extend the life of the EL display panel.

Furthermore, in an aspect of the EL display panel according to the present invention, it is preferable that the power supply line and the auxiliary line are arranged between the gate line and another gate line which is adjacent to and side-by-side with the gate line, and a width of a combination of the power supply line and the auxiliary line corresponds to a width of an interval between the gate line and the other gate line which is adjacent to and side-by-side with the gate line, and the power supply line and the auxiliary line are arranged in the proximity of the two adjacent gate lines to fill the interval between the two adjacent the gate lines.

When only the gate line is formed above the interlayer insulating film, the upper surface of the thin film semiconductor unit protrudes from a region in which the gate line is not formed as much as the thickness of the gate line.

In contrast, according to this aspect, the power supply line and the auxiliary line are used for flattening the upper surface of the thin film semiconductor unit, and the width of the combination of the power supply line and the auxiliary line corresponds to the width of an interval between the gate line and another gate line in parallel with the gate line and adjacent to the gate line. Thus, when the EL display panel is composed by arranging the EL unit including the EL device on the thin film semiconductor unit, the EL unit is less likely to be affected by the unevenness of the upper surface of the thin film semiconductor unit underneath. Therefore, the existing materials, the power supply line and the auxiliary line can be used as structure for increasing the flatness. Thus, it is possible to secure the flatness of the semiconductor thin film unit with a simple structure and to easily prevent the shortened life caused by insufficient flatness.

Furthermore, in an aspect of the EL display panel according to the present invention, it is preferable that a distance from the gate line to the power supply line, a distance from the power supply line to the auxiliary line, and a distance from the auxiliary line to the gate line are 4 µm or greater.

According to this aspect, the gate line, the power supply line, and the auxiliary line can be arranged such that they do not affect one another, thereby increasing the flatness of the thin film semiconductor unit.

Furthermore, in an aspect of the EL display panel according to the present invention, it is preferable that at least one of the power supply line and the auxiliary line is wider than a width of the gate line.

According to this aspect, having a wide power supply line flattens the upper surface of the thin film semiconductor unit using the power supply line. For example, when the EL display panel is composed by arranging the EL unit including the EL device on the thin film semiconductor unit, the EL unit is affected by the unevenness on the upper surface of the thin film semiconductor unit underneath. Making the power supply line wide secures the flatness with a simple structure using the existing material, the power supply line, and easily prevents the reduced life due to insufficient flatness.

In addition, making the power supply line substantially tabular allows the power supply line to be low-resistance line. Thus, the power is supplied from the power supply line with low line resistance to the first electrode or the second electrode. Thus, with respect to the IR drop generated along the increase in screen size of the EL display panel in the central region of the display area, it is possible to significantly reduce the IR drop amount.

Furthermore, in an aspect of the EL display panel according to the present invention, it is preferable that the semiconductor layer is of P-channel type, and the power supply line is arranged to overlap the semiconductor layer.

On the surface of the semiconductor layer and on the surface of the interlayer insulating film in the channel region of the thin film semiconductor unit, lattice defect occurs at the time of manufacturing. When the lattice defect occurs, there is an unstable interface state, causing the electric potential of the back channel of the channel region to be unstable.

In this aspect, the semiconductor layer covers the interlayer insulating film by the power supply line or the auxiliary line with positive electric potential above the channel region of the P-channel thin film semiconductor unit. This makes the electric potential of the back channel stable. As a result, it is possible to suppress the generation of off-leakage current in the thin film semiconductor unit. Thus, it is possible to implement an EL display panel with a thin film semiconductor unit with good off-characteristics.

Furthermore, in an aspect of the EL display panel according to the present invention, it is preferable that the semiconductor layer is of N-channel type, and the power supply line and the auxiliary line are arranged not to overlap the semiconductor layer.

When at least one of the power supply line and the auxiliary line with positive electric potential covers the interlayer insulating film above the channel region of the thin film semiconductor unit of N-channel type, negative carriers are induced at the back channel of the channel region, generating off-leakage current due to the negative carriers. With the carrier generated as described above, the current becomes the off-leakage current from the thin film semiconductor unit. As a result, the current is generated without applying the gate voltage, degrading the off characteristics of the thin film semiconductor unit.

According to this aspect, the auxiliary line prevents the carrier from being induced at the back channel of the N-channel TFT. As a result, it is possible to suppress the generation of off-leakage current in the thin film semiconductor unit. Thus, it is possible to implement an EL display panel with a thin film semiconductor unit with good off-characteristics.

Furthermore, in an aspect of the EL display panel according to the present invention, it is preferable that the first electrode is a source electrode, and the second electrode is a drain electrode.

According to this aspect, the first electrode is a source electrode, and the second electrode is a drain electrode.

Furthermore, in an aspect of the EL display panel according to the present invention, it is preferable that the first electrode is a drain electrode, and the second electrode is a source electrode.

According to this aspect, the first electrode is a drain electrode, and the second electrode is a source electrode.

Furthermore, in an aspect of the EL display panel according to the present invention, it is preferable that the semiconductor layer includes a polycrystalline semiconductor layer.

According to this aspect, the polycrystalline semiconductor layer increases the carrier mobility. Thus, it is possible to implement an EL display panel including the thin film transistor with good on characteristics.

Furthermore, in an aspect of the EL display panel according to the present invention, it is preferable that material composing the power supply line and the auxiliary line includes one of Al, Cu, and Ag.

According to this aspect, the power supply line and the auxiliary line can be composed of material including Al, Cu, and Ag which are metals with low resistivity among the material for lines. Thus, it is possible to further reduce the electric resistance of the power supply line and the auxiliary line.

Furthermore, in an aspect of the EL display panel according to the present invention, it is preferable that the EL unit is an organic EL unit having an organic light-emitting layer as the light-emitting layer.

According to this aspect, it is possible to implement an EL display panel with high display capability.

Furthermore, in an aspect of the EL display apparatus according to the present invention, the EL display apparatus includes the EL display panel.

According to this aspect, it is possible to implement the EL display apparatus with the features described above.

Furthermore, the method of manufacturing the EL display panel according to an aspect of the present invention includes a first process of preparing a substrate; a second process of forming a gate electrode above the substrate; a third process of forming a gate insulating film above the substrate to cover the gate electrode; a fourth process of forming a semiconductor layer on the gate insulating film and above the gate electrode; a fifth process of forming a first electrode above the semiconductor layer and forming a source line electrically connected to the first electrode, and a second electrode; a sixth process of forming a first interlayer insulating film above the gate insulating film to cover the first electrode and the second electrode; a seventh process of forming a first contact hole through the gate insulating film and the first interlayer insulating film; an eighth process of forming a second contact hole through the first interlayer insulating film, the second contact hole passing through the first interlayer insulating film above the gate electrode and being different from the first contact hole; a ninth process of forming, by forming a metal film on the first interlayer insulating film and patterning the metal film, (i) a gate line electrically connected to the gate electrode through the first contact hole, (ii) a power supply line electrically connected to the first electrode or the second electrode through the second contact hole and side-by-side with the gate line, and (iii) an auxiliary line side-by-side with the gate line and the power supply line and electrically connected to the cathode electrode; a tenth process of forming a second interlayer insulating film to cover upper surfaces of the first interlayer insulating film, the power supply line, and the auxiliary line; an eleventh process of forming a third contact hole through the second interlayer insulating film; and a twelfth process of forming, above the second interlayer insulating film, an EL unit including a pair of an anode electrode and a cathode electrode, and a light-emitting layer interposed between the anode electrode and the cathode electrode, in which, in the twelfth process, the cathode electrode and the auxiliary line are electrically connected through the third contact hole.

With this aspect, the EL display apparatus according to the present invention can be easily manufactured.

Furthermore, in an aspect of the method of manufacturing EL display panel according to the present invention, the semiconductor layer formed in the fourth process is a non-crystalline semiconductor film, and the method further includes, between the fourth process and fifth process, a process of crystallizing the non-crystalline semiconductor film by irradiating the non-crystalline semiconductor film with a laser to heat the non-crystalline semiconductor film to a predetermined temperature range.

According to this aspect, it is possible to form a semiconductor layer including the polycrystalline semiconductor film.

Furthermore, in an aspect of the method of manufacturing EL display panel according to the present invention, it is preferable that the EL unit is an organic EL unit having an organic light-emitting layer as the light-emitting layer.

According to this aspect, it is possible to manufacture the EL display panel with high display capability.

The following specifically describes embodiments of the present invention with reference to the drawings.

First Embodiment

First, the organic electro-luminescence (EL) panel according to the first embodiment of the present invention shall be described with reference to FIG. 1. FIG. 1 is a partial cutout perspective view of an organic EL display panel according to the first embodiment of the present invention.

As illustrated in FIG. 1, the EL display panel 1 according to the first embodiment of the present invention is an organic EL display panel (organic EL display), and includes an organic EL device 10 which is a light-emitting display device, and a thin film semiconductor array device 20 composed of an active matrix substrate in which a thin film transistor and lines are formed. Note that, the organic EL device 10 corresponds to the EL unit according to the present invention, and the thin film semiconductor array device for display apparatus 20 corresponds to the thin film semiconductor unit in the present invention.

The organic EL device 10 includes a lower electrode 12, an organic light-emitting layer 13, and an upper electrode 14 that are sequentially formed on the thin film semiconductor array device 20. The organic light-emitting layer 13 is composed of an electron transport layer, a light-emitting layer, and a hole transport layer, and others.

The thin film semiconductor array device for display apparatus 20 includes pixels 100 arranged in a matrix (in rows and columns), and each of the pixels 100 includes a pixel circuit 30 including a thin film transistor (not illustrated). The thin film semiconductor array device for display apparatus 20 includes gate lines 21 and source lines 22 arranged in a matrix. Multiple lines are arranged in row direction (horizontal direction) as the gate lines 21, and multiple lines are arranged in column direction (vertical direction) as the source lines 22. In addition, the gate lines 21 and the source lines 22 are orthogonal to each other, and each of them connects each pixel circuit 30 and a control circuit (not illustrated).

Each pixel circuit 30 includes at least two thin film transistors provided as a switching device for selecting the pixel 100 and a driving device for driving the organic EL device 10.

Note that, although not illustrated in FIG. 1, the thin film semiconductor array device for display apparatus 20 includes power supply lines 23 arranged in column direction. The power supply lines 23 are connected to thin film transistors as driving devices of pixels 100. The power supply lines 23 shall be described in detail later.

As such, the organic EL display panel 1 according to the first embodiment utilizes active matrix technology in which display control is performed for each pixel 100 partitioned by the gate lines 21 and the source lines 22.

Figure 2:
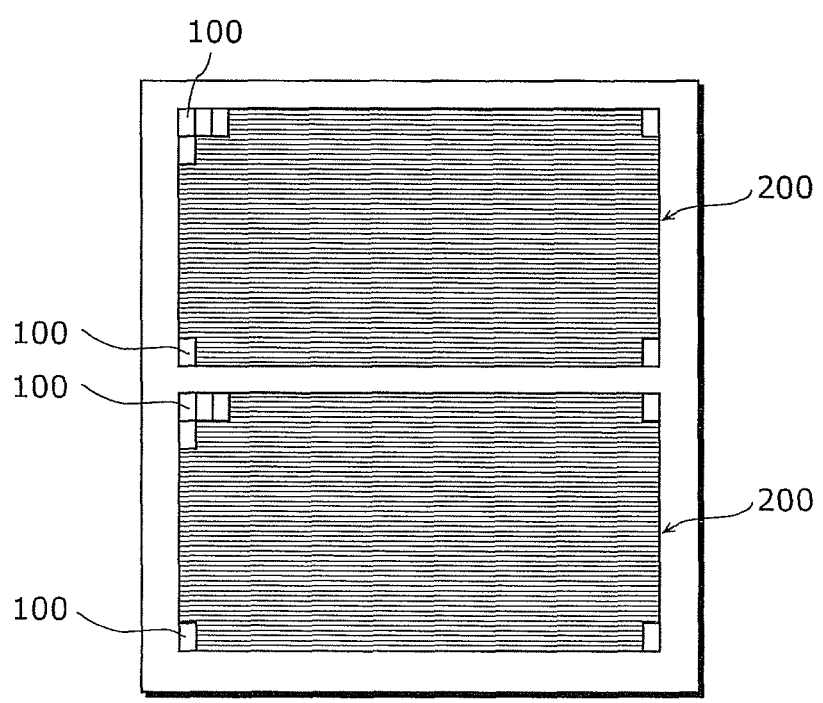
FIG. 2 illustrates a mother board of the thin film semiconductor array device for display apparatus according to the first embodiment of the present invention.

Next, an example of the thin film semiconductor array device for display apparatus according to the first embodiment of the present invention shall be described with reference to FIG. 2. FIG. 2 illustrates a mother board of the thin film semiconductor array device for display apparatus according to the first embodiment of the present invention.

As illustrated in FIG. 2, the mother board includes two display units 200, and two thin film semiconductor array devices for display apparatus 20 are obtained by cutting the mother board into two pieces. As described above, each display unit 200 includes the pixels 100 arranged in a matrix (in rows and columns). Note that, in FIG. 2, only the pixels 100 at the corners of the display unit 200 are illustrated. Note that, in FIG. 2, the mother board includes two display units 200. However, the mother board may include two or more display units 200, or only one display unit 200.

Figure 3:
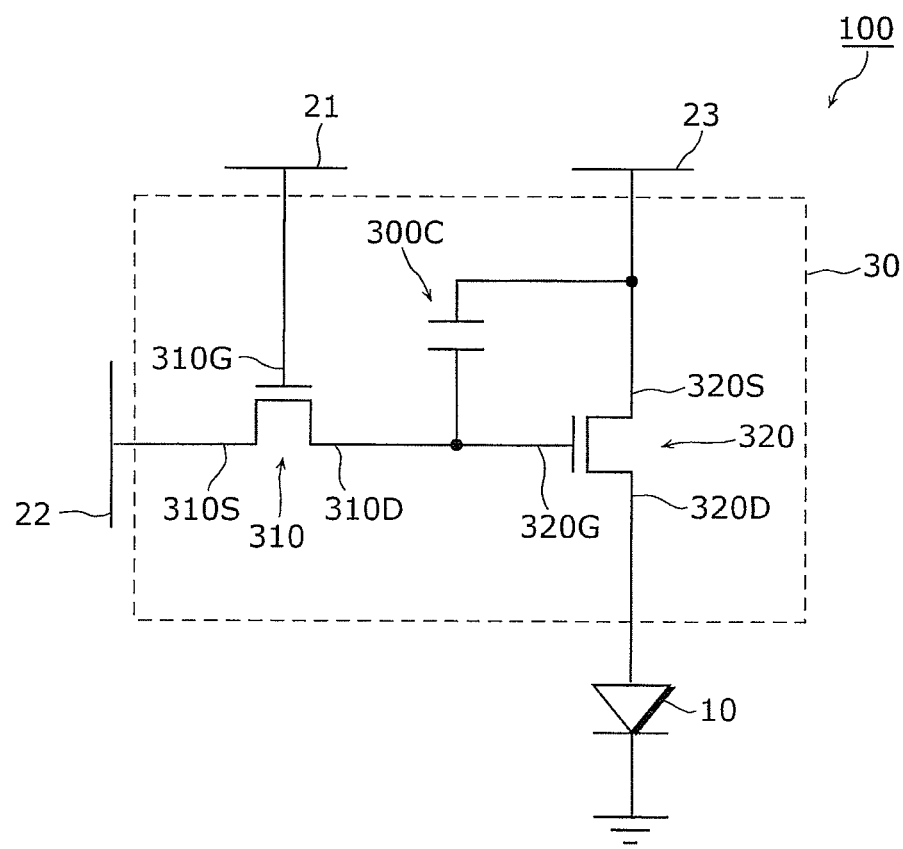
FIG. 3 illustrates a circuit configuration of one pixel in an EL display panel according to the first embodiment of the present invention.

The following describes the circuit configuration of the pixel in the EL display panel according to the first embodiment of the present invention with reference to FIG. 3. FIG. 3 illustrates a circuit configuration of one pixel in an EL display panel 1 according to the first embodiment of the present invention. In the first embodiment illustrated in FIGS. 3 to 18, description is made using P-channel TFTs as an example of the first thin film transistor and the second thin film transistor.

As illustrated in FIG. 3, each pixel 100 includes: a pixel circuit 30 including a first thin film transistor 310, a second thin film transistor 320, and a capacitor 300C; and an organic EL device 10. The first thin film transistor 310 is a selector transistor for selecting the pixel 100 (switching transistor), and the second thin film transistor 320 is a driver transistor for driving the organic EL device 10.

The first thin film transistor 310 includes a first source electrode 310S, a first drain electrode 310D, and a first gate electrode 310G. The first source electrode 310S is connected to the source line 22, and the first gate electrode 310G is connected to the gate line 21. Furthermore, the first drain electrode 310D is connected to the capacitor 300C and the second gate electrode 320G of the second thin film transistor 320. When voltage is applied to the gate line 21 and the source line 22, the first thin film transistor 310 stores the voltage value applied to the source line 22 in the capacitor 300C as display data.

The second thin film transistor 320 includes a second source electrode 320S, a second drain electrode 320D, and a second gate electrode 320G. The second drain electrode 320D is connected to the anode of the organic EL device 10, and the second source electrode 320S is connected to the power supply line 23. The second gate electrode 320G is connected to the first drain electrode 310D of the first thin film transistor 310. The second thin film transistor 320 supplies current corresponding to the voltage value held by the capacitor 300C to the lower electrode 12 of the organic EL device 10 through the second source electrode 320S and the second drain electrode 320D from the first power supply line 23.

In the pixel 100 with the configuration described above, when the gate line 21 receives a gate signal turning on the first thin film transistor 310, the signal voltage supplied through the source line 22 is written on the capacitor 300C. The hold voltage written on the capacitor 300C is held for one frame period. With the hold voltage, the conductance of the second thin film transistor 320 changes in an analog manner, and the driving current corresponding to luminescence gradation flows from the lower electrode 12 which is an anode to the upper electrode 14 which is a cathode of the organic EL device 10. As such, the organic EL device 10 emits light, and an image is displayed.

Figure 4:
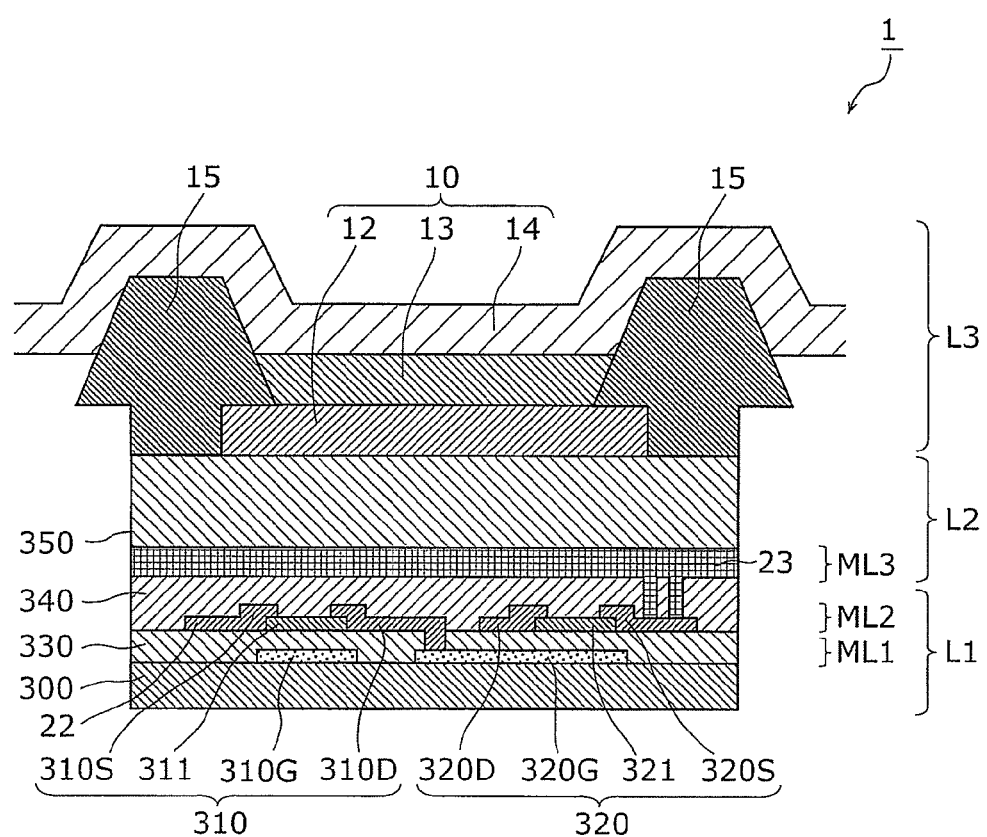
FIG. 4 is a cross sectional view of the configuration of a pixel schematically illustrating part of a pixel in the EL display panel according to the first embodiment of the present invention.

Next, the configuration of a pixel in the EL display panel 1 according to the first embodiment of the present invention shall be described with reference to FIG. 4. FIG. 4 illustrates a circuit configuration of part of one pixel in an EL display panel 1 according to the first embodiment of the present invention.

Fs illustrated in FIG. 4A, each pixel included in the EL display panel 1 according to the first embodiment of the present invention includes the first thin film transistor 310 which is a switching transistor, and the second thin film transistor 320 which is a driving transistor for driving the organic EL device 10. As described above, the first thin film transistor 310 includes the first source electrode 310S, the first drain electrode 310D, and the first gate electrode 310G. The second thin film transistor 320 includes the second source electrode 320S, the second drain electrode 320D, and the second gate electrode 320G.

As illustrated in FIG. 4, the first gate electrode 310G and the second gate electrode 320G are formed in each pixel above the substrate 300. Furthermore, the gate insulating film 330 is formed to cover the first gate electrode 310G and the second gate electrode 320G.

The first semiconductor layer 311 is formed above the first gate electrode 310G and on the gate insulating film 330. The second semiconductor layer 321 is formed above the first gate electrode 320G and on the gate insulating film 330.

The first source electrode 310S and the first drain electrode 310D are separately arranged opposite to each other, each covering part of the first semiconductor layer 311. The second source electrode 320S and the second drain electrode 320D are separately arranged opposite to each other, each covering part of the second semiconductor layer 321.

The first source electrode 310S of the first thin film transistor 310 is electrically connected to the source line 22.

In addition, the first interlayer insulating film (lower interlayer insulating film) 340 is formed to cover the first thin film transistor 310 and the second thin film transistor 320.

The power supply line 23 is formed above the first interlayer insulating film 340. The power supply line 23 is electrically connected to the second source electrode 320S through a contact hole formed in the first interlayer insulating film 340.

The second interlayer insulating film (upper interlayer insulating film) 350 is formed above the first interlayer insulating film 340 to cover the power supply line 23.

The organic EL device 10 including the lower electrodes 12, the organic light emitting layer 13 and the upper electrode 14 that are sequentially formed is formed on the second interlayer insulating film 350. The bank 15 is formed on the second interlayer insulating film 350 at the boundary of adjacent pixels. The lower electrode 12 and the organic light emitting layer 13 are formed in the opening between adjacent banks 15.

Each lower electrode 12 is an anode arranged for each pixel, and is formed on the second interlayer insulating film 350. The lower electrode 12 is electrically connected to the second drain electrode 320D of the second thin film transistor through the contact hole through the first interlayer insulating film 340 and the second interlayer insulating film 350.

The organic light emitting layer (organic EL layer) 13 is formed for each color (sub-pixel column) or each sub pixel, and is made of a predetermined organic luminescent material.

The upper electrode 14 is a cathode formed above the organic light emitting layer 13 over multiple pixels, and is made of a transparent electrode such as ITO. In this embodiment, the upper electrode 14 is a common electrode shared by all of the pixels.

In the EL display panel 1 with the structure described above, the lowermost layer in which the thin film transistor is formed is referred to as a TFT layer (TFT unit) L1, the uppermost layer in which the organic EL device 10 is formed is referred to as the organic EL layer (organic EL unit) L3, and the layer between the TFT layer L1 and the organic EL layer L3 and in which the line is formed is referred to as a line layer (line unit) L2.

As illustrated in FIG. 4, the power supply line 23, the auxiliary line 25 (see FIG. 6), and the gate line 21 (see FIG. 6) are formed in the line layer L2. The auxiliary line 25 is electrically connected to the upper electrode 14 of the organic EL device 10, and is capable of applying a predetermined voltage to the upper electrode 14 as the EL power supply line, and keeps the upper electrode 14 grounded. The auxiliary line 25 is provided to prevent the voltage drop that occurs in the central region of the EL display panel 1 along the increase in the size of the EL display panel. Note that, the TFT layer L1 and the line layer L2 corresponds to the thin film semiconductor unit in the present invention, and the organic EL layer L3 corresponds to the EL unit according to the present invention.

Furthermore, in the TFT layer L1, the layer in which the first gate electrode 310G and the second gate electrode 320G are formed is referred to as a first metal layer ML1. In addition, a layer in which the first source electrode 310S and the first drain electrode 310D and the second source electrode 320S and the second drain electrode 320D are formed is referred to as a second metal layer ML2. Accordingly, as illustrated in FIG. 4, in this embodiment, the source line 22 is formed in the second metal layer ML2.

In the line layer L2, a layer in which the gate line 21 (see FIG. 6), the power supply line 23, and the auxiliary line 25 (see FIG. 6) are formed is referred to as a third metal layer ML3.

In the first metal layer ML1 to the third metal layer ML3, the metal material such as the electrodes and the line formed in the same metal layer can be formed at the same time by patterning the same metal film.

Figure 5:
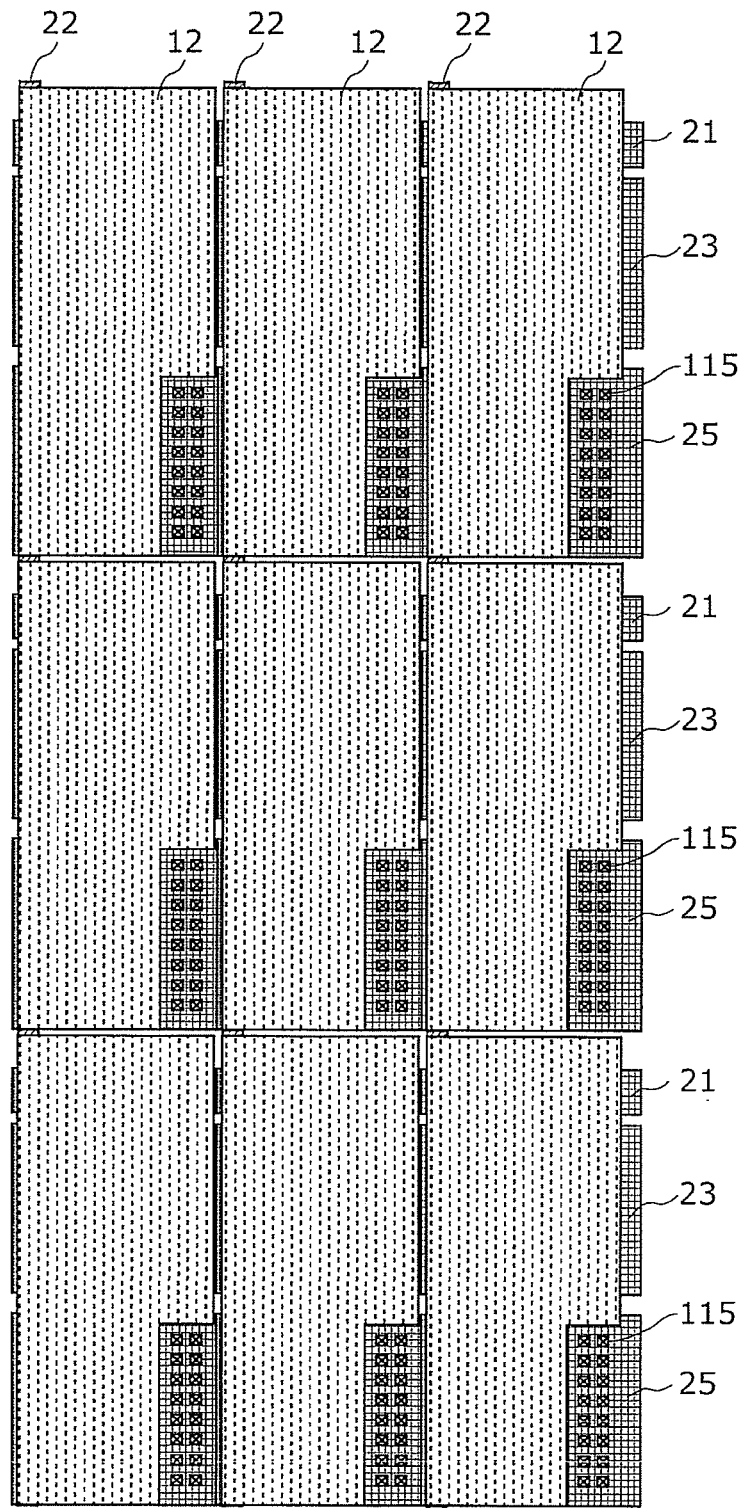
FIG. 5 is a planar view of the thin film semiconductor array device for display apparatus in the EL display panel according to the first embodiment of the present invention.
Figure 6:
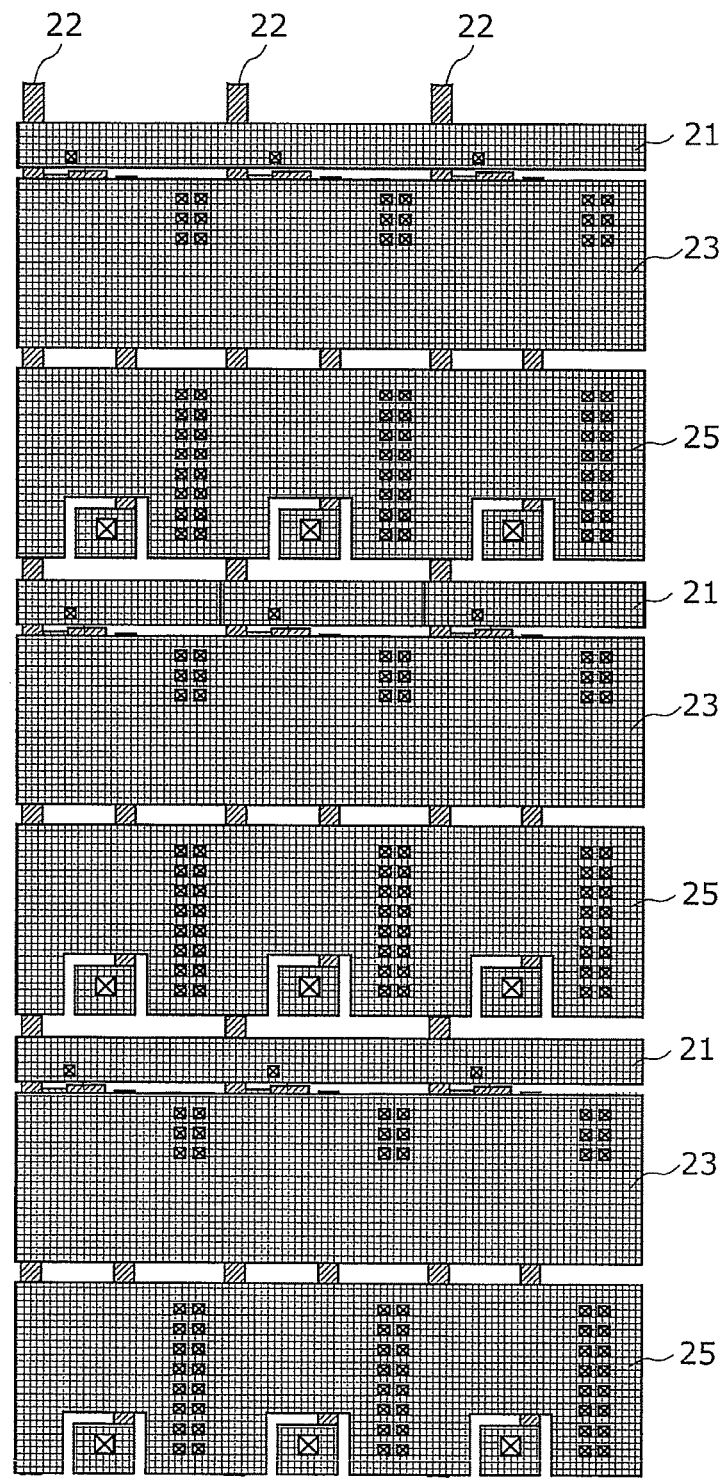
FIG. 6 is a planar view of the thin film semiconductor array device for display apparatus (partially see-through) in the EL display panel according to the first embodiment of the present invention.
Figure 7:
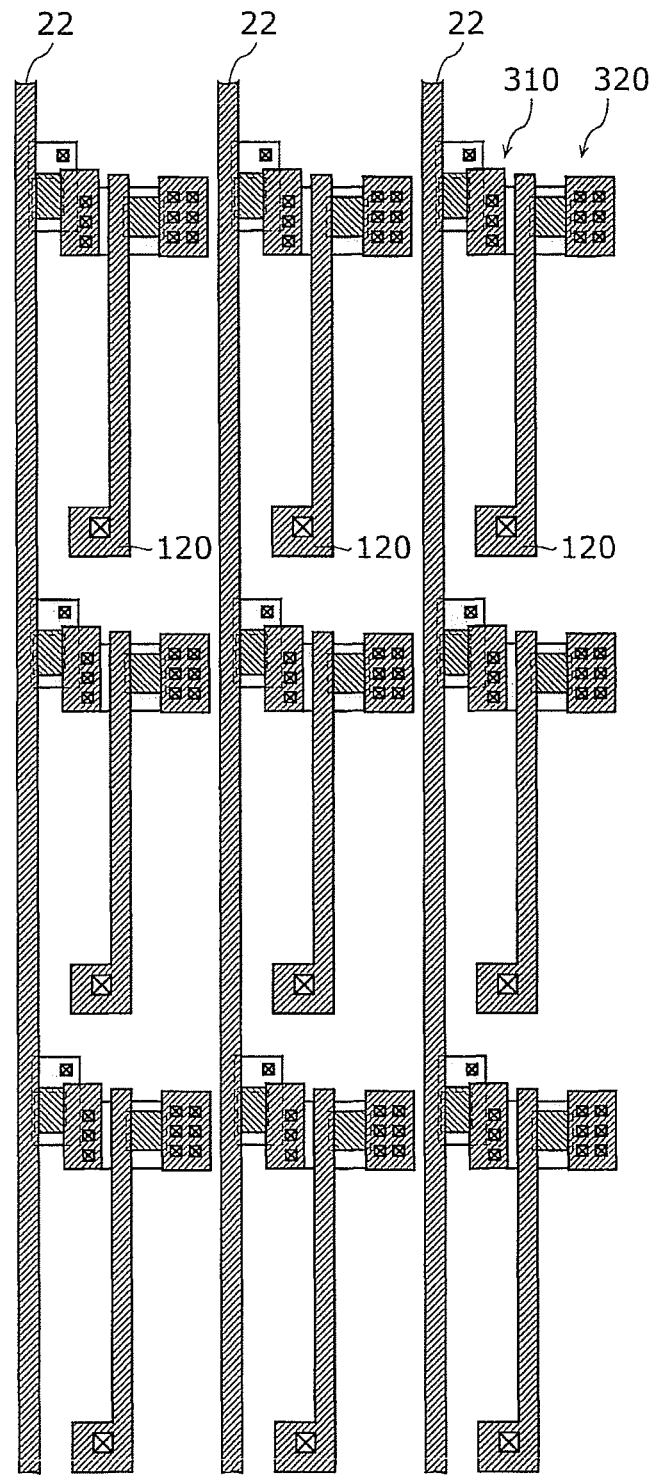
FIG. 7 is a planar view of the thin film semiconductor array device for display apparatus (partially see-through) in the EL display panel according to the first embodiment of the present invention.

Next, the configuration of in the EL display panel 1 according to the first embodiment of the present invention shall be described with reference to FIGS. 5 to 7. FIG. 5 is a planar view of the thin film semiconductor array device for display apparatus 20 comprising the EL display panel 1 according to the first embodiment of the present invention. FIG. 6 is a planar view of the thin film semiconductor array device for display apparatus according to the first embodiment of the present invention, illustrating the components, seeing through the anode and the second interlayer insulating film formed in the organic EL layer L3. FIG. 7 is a planar view of the thin film semiconductor array device for display apparatus 20 according to the first embodiment of the present invention, seeing-through the lines and the insulating film formed in the line layer L2.

As illustrated in FIG. 5, the thin film semiconductor array device according to the first embodiment of the present invention includes pixels 100 arranged in a matrix (rows and columns). As illustrated in FIG. 6, under the lower electrodes 12, the gate lines 21, the power supply lines 23 and the auxiliary lines 25 are arranged along the row direction of the pixels 100.

The power supply lines 23 are arranged side-by-side with the gate lines 21. Furthermore, the auxiliary lines 25 are arranged in intervals between the gate lines 21 of the pixels 100 adjacent to the power supply lines 23, side-by-side with the power supply lines 23 and the gate lines 21. In other words, the gate lines 21, the power supply lines 23 and the auxiliary lines 25 are arranged in row direction side-by-side with each other. In addition, the gate lines 21, the power supply lines 23 and the auxiliary lines 25 are formed in the same layer.

FIG. 6 illustrates a diagram of FIG. 5, seeing through the gate lines 21, the power supply lines 23, and the auxiliary lines 25.

As illustrated in FIG. 6, the thin film semiconductor array device for display apparatus 20 according to the first embodiment of the present invention includes source lines 22 arranged in parallel with each other along the column direction of the pixels 100. The source lines 22 is formed in the second metal layer ML2 in the TFT layer L1 illustrated in FIG. 4, and are arranged to three-dimensionally cross the gate lines 21, the power supply lines 23 and the auxiliary line 25 formed in the line layer L2 above. The thin film semiconductor array device for display apparatus 20 includes the first thin film transistor 310 and the second thin film transistor 320.

Figure 8:
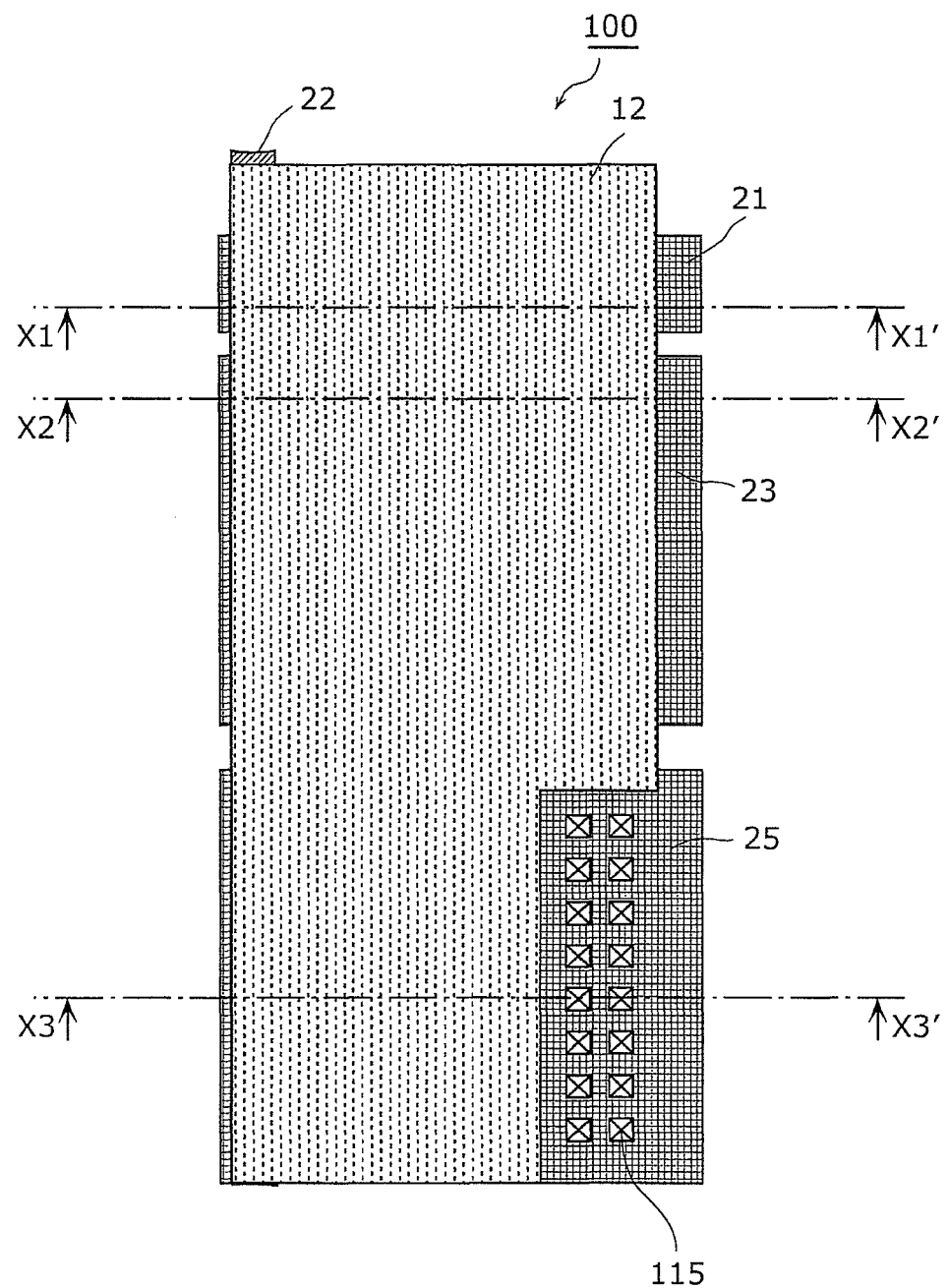
FIG. 8 is a planar view of the thin film semiconductor array device for display apparatus in the EL display panel according to the first embodiment of the present invention.
Figure 9:
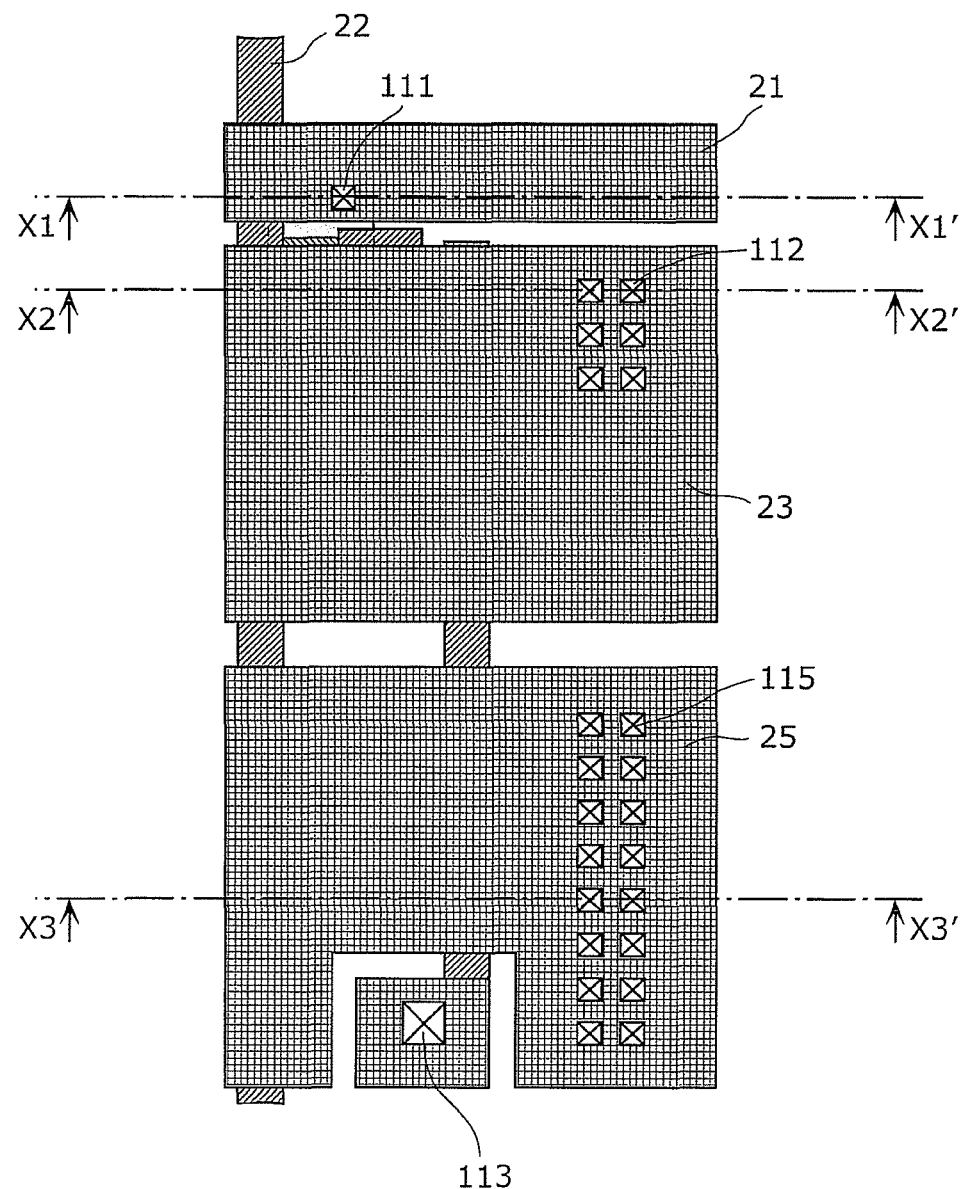
FIG. 9 is a planar view of the thin film semiconductor array device for display apparatus (partially see-through) in the EL display panel according to the first embodiment of the present invention.
Figure 10:
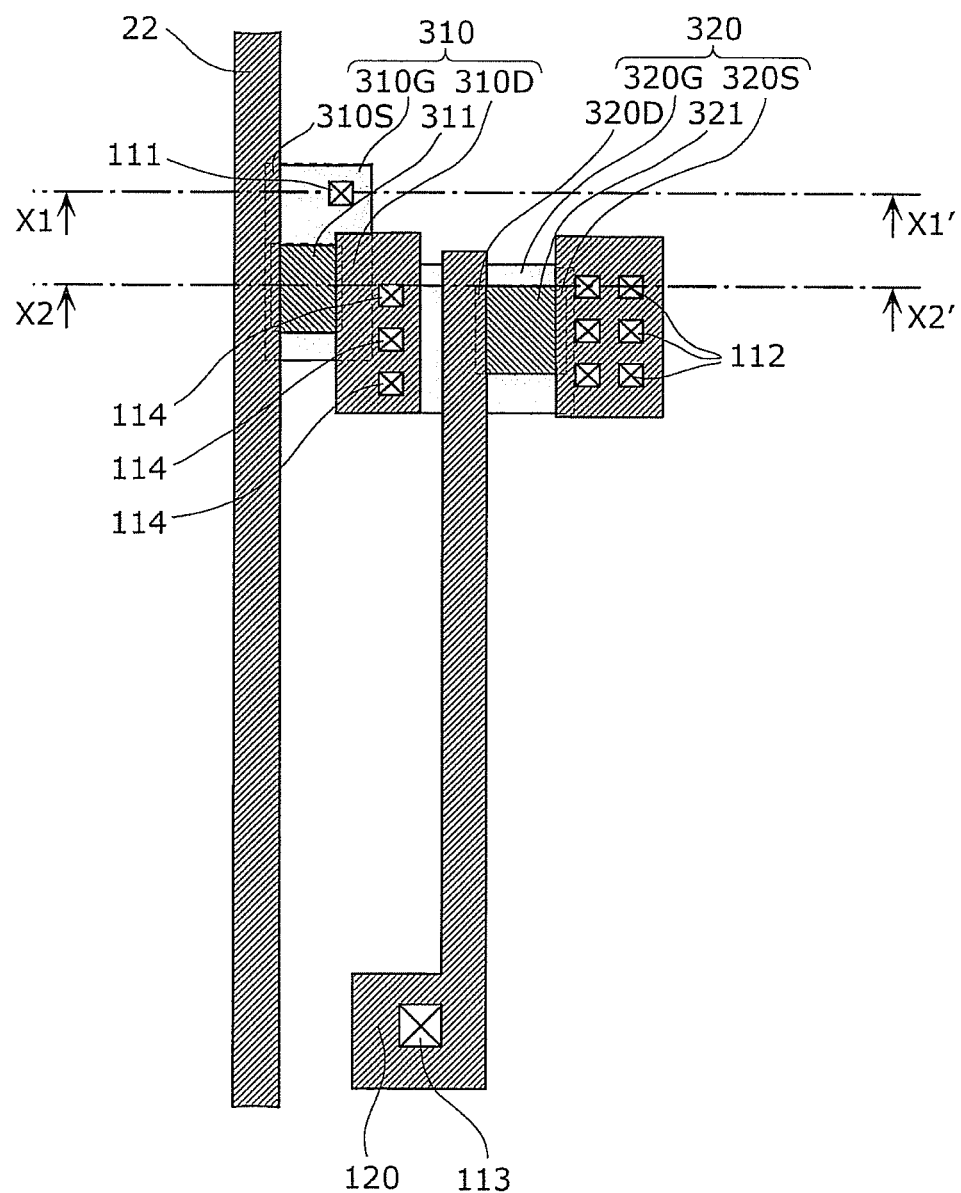
FIG. 10 is a planar view of the thin film semiconductor array device for display apparatus (partially see-through) in the EL display panel according to the first embodiment of the present invention.
Figure 11:
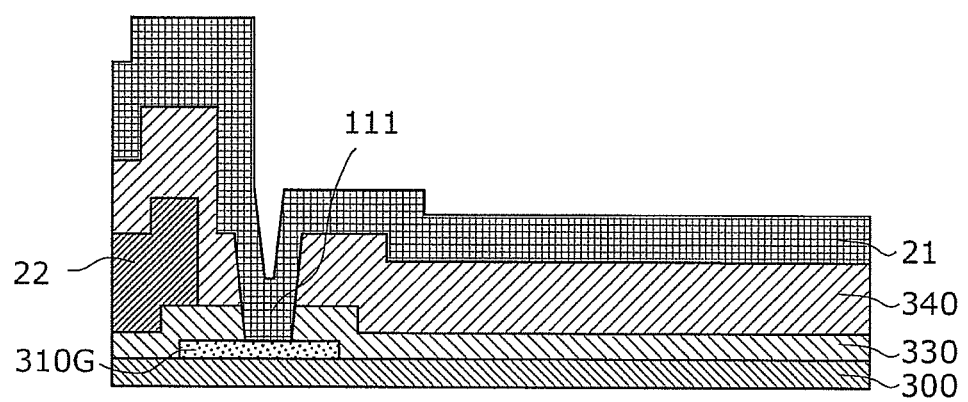
FIG. 11 is a cross-sectional view of the thin film semiconductor device for display apparatus in the EL display panel according to the first embodiment of the present invention (a cross-sectional view along X1-X1' in FIG. 8)
Figure 12:
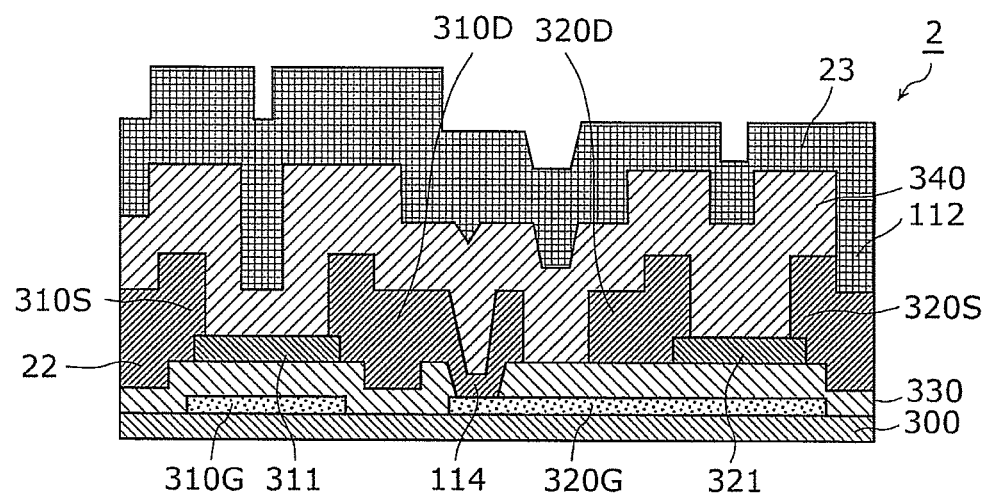
FIG. 12 is a cross-sectional view of the thin film semiconductor device for display apparatus in the EL display panel according to the first embodiment of the present invention (a cross-sectional view along X2-X2' in FIG. 8)
Figure 13:
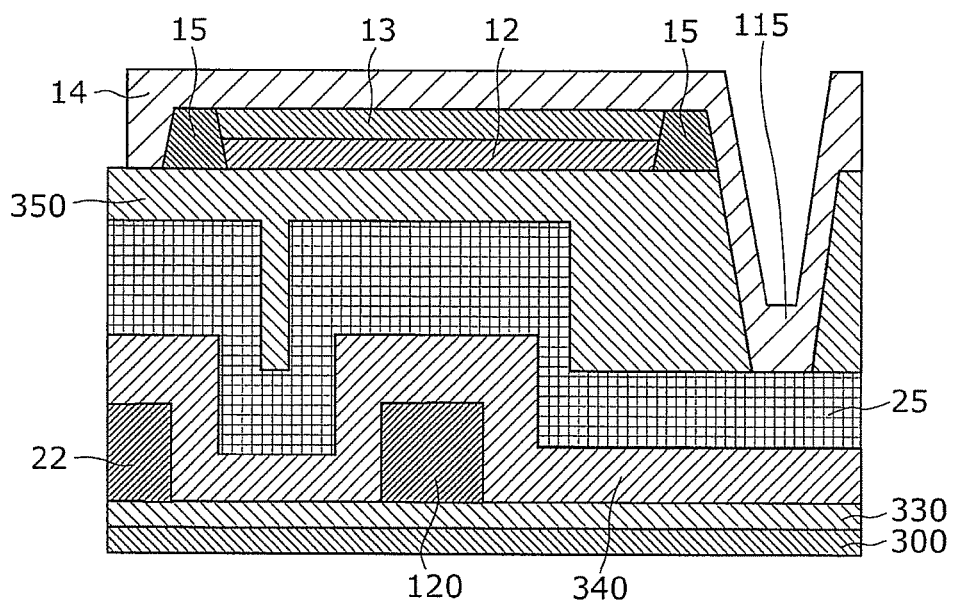
FIG. 13 is a cross-sectional view of the thin film semiconductor device for display apparatus in the EL display panel according to the first embodiment of the present invention (a cross-sectional view along X3-X3' in FIG. 8)

The pixel 100 included in the EL display panel 1 according to the first embodiment of the present invention shall be described with reference to FIGS. 8 to 13. FIG. 8 is a planar view of the pixel 100 of the EL display panel according to the first embodiment of the present invention, and illustrates the pixel with the anode arranged. Furthermore, FIG. 9 is a planar view of the pixel 100 according to the first embodiment of the present invention, seeing through the anode formed in the organic EL layer L3. FIG. 10 is a planar view of the pixel 100 according to the first embodiment of the present invention, seeing through the lines and insulating films formed in the line layer L2. FIG. 11 is a cross-sectional view of the pixel 100 along the line X1-X1' in FIGS. 8 to 10. FIG. 12 is a cross-sectional view of the pixel 100 along the line X2-X2' in FIGS. 8 to 10. FIG. 13 is a cross-sectional view of the pixel 100 along the line X3-X3' in FIGS. 8 to 10.

As illustrated in FIGS. 8 to 10, the pixel 100 included in the EL display panel 1 according to the first embodiment of the present invention includes a substrate 300, a first thin film transistor 310, the second thin film transistor 320, a gate line 21, a source line 22, a power supply line 23, an auxiliary line 25, and a first interlayer insulating film 340. Note that, in FIGS. 9 to 12, the configuration above the first interlayer insulating film 340 is omitted.

The first thin film transistor 310 is a multilayered structure of a first gate electrode 310G, a gate insulating film 330, a first semiconductor layer 311 (channel layer), the first source electrode 310S, and the first drain electrode 310D. The second thin film transistor 320 is a multilayered structure of a second gate electrode 320G, a gate insulating film 330, a second semiconductor layer 321 (channel layer), the second source electrode 320S, and the second drain electrode 320D.

In this embodiment, the first thin film transistor 310, the second thin film transistor 320, and the source line 22 are formed in the TFT layer L1 illustrated in FIG. 4. Furthermore, the gate line 21, the power supply line 23 and the auxiliary line 25 are formed in the line layer L2 illustrated in FIG. 4.

The following specifically describes the components of the EL display panel 1 according to the first embodiment of the present invention from the component in the lowermost layer.

As illustrated in FIGS. 8 to 12, the first gate electrode 310G and the second gate electrode 320G are formed in island shape above the substrate 300 illustrated in FIG. 4.

Furthermore, the gate insulating film 330 is formed above the substrate 300 to cover the first gate electrode 310G and the second gate electrode 320G as illustrated in FIGS. 11 and 12.

In addition, the first semiconductor layer 311 is patterned in island shape on the gate insulating film 330 and above the first gate electrode 310G, as illustrated in FIGS. 11 and 12. Furthermore, above the second gate electrode 320G on the gate insulating film 330, the second semiconductor layer 321 is patterned in island shape.

Here, P-channel semiconductors are used for the first semiconductor layer 311 and the second semiconductor layer 321. Positive electric potentials are supplied to the power supply lines 23.

As illustrated in FIGS. 10 and 12, the first source electrode 310S and the first drain electrode 310D in the first thin film transistor 310 is formed above the first semiconductor layer 311 partially overlapping the first semiconductor layer 311. In addition, the first source electrode 310S and the first drain electrode 310D are formed in positions opposite to each other interposing the first semiconductor layer 311 in the planar view illustrated in FIG. 10. The first source electrode 310S and the first drain electrode 310D are formed in the second metal layer ML2 in the TFT layer L1 illustrated in FIG. 4. Note that, the term "overlapping" in this specification refers to a positional relationship overlapping each other when viewed in the vertical direction of the pixels 100.

Furthermore, as illustrated in FIGS. 11 and 12, the first drain electrode 310D is formed to overlap the second gate electrode 320G of the second thin film transistor 320. The first drain electrode 310D and the second gate electrode 320G are electrically connected by a fourth contact portion 114 (fourth conductive portion). The fourth contact portion 114 is formed by burying conductive material in the contact hole formed in a thickness direction at a position where the first drain electrode 310D and the second gate electrode 320G overlap. In this embodiment, as illustrated in FIG. 12, the fourth contact portion 114 is formed by burying part of the first drain electrode 310D in the contact hole formed through the gate insulating film 330.

Note that, as illustrated in FIG. 12, the fourth contact hole corresponding to the fourth contact portion 114 is formed in the gate insulating film 330. In this embodiment, three fourth contact portions 114 are formed as illustrated in FIG. 10.

As illustrated in FIGS. 10 and 12, the second source electrode 320S and the second drain electrode 320D in the second thin film transistor 320 is formed above the second semiconductor layer 321 partially overlapping the second semiconductor layer 321. In addition, the second source electrode 320S and the second drain electrode 320D are formed in positions opposite to each other interposing the second semiconductor layer 321 in the planar view illustrated in FIG. 10. The second source electrode 320S and the second drain electrode 320D are formed in the second metal layer ML2 in the TFT layer L1.

Furthermore, as illustrated in FIG. 10, the second drain electrode 320D extends linearly along the column direction, and an island-shaped electrode portion 120 wider than the extended portion is formed near an end opposite to an end on which the second semiconductor layer 321 is formed.

The electrode portion 120 is electrically connected to the lower electrodes 12 of the organic EL device 10 through the third contact portion 113. The third contact portion 113 is formed by burying conductive material to the contact hole formed through the first interlayer insulating film 340 and the second interlayer insulating film 350 formed in the upper layer of the electrode portion 120.

The source line 22 is linearly formed along the column direction of the pixels 100, as illustrated in FIGS. 8 to 10. The source line 22 is arranged to pass near the first thin film transistor 310, and is electrically connected to the first source electrode 310S.

In this embodiment, the source line 22 and the first semiconductor layer 311 are overlapped with each other such that part of the linear source line 22 serves as the first source electrode 310S. In this embodiment, the source lines 22 are formed in the TFT layer L1 illustrated in FIG. 4, and in the second metal layer ML2.

Note that, the source line 22 is formed above the gate insulating film 330 except for the portion overlapping with the first thin film transistor 310. In addition, the source line 22 is formed to three-dimensionally cross the gate line 21, the power supply line 23, and the auxiliary line 25 to be described later, through the first interlayer insulating film 340.

In addition, as illustrated in FIGS. 11 and 12, the first interlayer insulating film 340 is formed to cover the first thin film transistor 310, the second thin film transistor 320, the source line 22, and the power supply line 23. The first interlayer insulating film 340 is the uppermost layer of the TFT layer L1, and is formed to cover the entire electrodes and lines formed underneath.

Furthermore, above the first interlayer insulating film 340, the gate line 21, the power supply line 23, and the auxiliary line 25 are formed. The gate line 21, the power supply line 23, and the auxiliary line 25 are both formed in the third metal layer ML3 in the line layer L2 illustrated in FIG. 4.

The gate line 21 is linearly formed along the row direction of the pixels 100, as illustrated in FIGS. 9 and 11. Furthermore, the gate line 21 is formed above the first interlayer insulating film 340 as illustrated in FIG. 11, and is formed in the third metal layer ML3 in the line layer L2 illustrated in FIG. 4. More specifically, the gate line 21 is formed in a layer different from a layer in which the first gate electrode 310G is formed.

Furthermore, the gate line 21 is arranged to pass through the proximity of the first thin film transistor 310, and is electrically connected to the first gate electrode 310G. In this embodiment, as illustrated in FIGS. 9 and 11, the gate line 21 and the first gate electrode 310G are arranged to three-dimensionally cross each other, and the gate line 21 and the first gate electrode 310G are electrically connected through the first contact portion 111 (first conductive portion). The first contact portion 111 is formed by burying conductive material to the contact hole formed in the thickness direction in a position where the gate line 21 and the first gate electrode 310G overlap each other. In this embodiment, the first contact portion 111 is formed by burying part of the gate line 21 in the first contact hole through the first interlayer insulating film 340 and the gate insulating film 330 as illustrated in FIG. 11.

The gate line 23 is linearly formed along the row direction of the pixels 100, as illustrated in FIGS. 9 and 12. In addition, as illustrated in FIG. 12, the power supply line 23 is formed above the first interlayer insulating film 340, and is formed in the third metal layer ML3 in the line layer L2 illustrated in FIG. 4. More specifically, the power supply line 23 is formed in the same layer as the gate line 21.

Furthermore, the power supply line 23 is arranged side-by-side with the gate line 21, as illustrated in FIG. 9. Furthermore, the power supply line 23 is arranged to three-dimensionally cross the second source electrode 320S, and at the intersection (overlapping portion), the power supply line 23 is electrically connected through the second contact portion 112 (second conductive portion) formed in the thickness direction. The second contact portion 112 is formed by burying conductive material on the contact hole formed in thickness direction in a position in which the power supply line 23 and the second source electrode 320S overlaps as illustrated in FIG. 12. In this embodiment, the second contact portion 112 is formed by burying part of the power supply line 23 in the contact hole formed through the first interlayer insulating film 340. Furthermore, in this embodiment, 6 second contact portions 112 (2 rows and 3 columns) are formed as illustrated in FIG. 9.

The auxiliary line 25 is linearly formed along the row direction of the pixels 100, as illustrated in FIGS. 9 and 13. In addition, as illustrated in FIG. 12, the power supply line 23 is formed above the first interlayer insulating film 340, and is formed in the third metal layer ML3 in the line layer L2 illustrated in FIG. 4. More specifically, the auxiliary line 25 is formed in the same layer as the gate line 21 and the power supply line 23.

In addition, the auxiliary line 25 is arranged side-by-side with the gate line 21 and the power supply line 23 as illustrated in FIG. 9. Furthermore, on the auxiliary line 25, the second interlayer insulating film 350 and the organic EL layer L3 illustrated in FIG. 4 are formed. More specifically, on the second interlayer insulating film 35G, the lower electrodes 12, the EL layer 13 and the upper electrode 14 are sequentially formed. In addition, as illustrated in FIG. 13, the upper electrode 14 and the auxiliary line 25 are electrically connected through the fifth contact portion 115 (third conductive portion). As illustrated in FIG. 13, the fifth contact portion 115 is formed by burying the conductive material on the contact hole formed in thickness direction at a position in which the upper electrode and the auxiliary line 25 overlap. In this embodiment, the fifth contact portion 115 is formed by burying part of the upper electrode 14 in the contact hole formed through the second interlayer insulating film 350. Furthermore, in this embodiment, 14 (two rows and seven columns) fifth contact portions 115 are provided.

Note that, in this embodiment, the material composing the power supply line 23 and the auxiliary line 25 are composed of one material selected from Al (aluminum), Cu (copper), Ag (silver). Furthermore, the power supply line 23 and the auxiliary line 25 may be multilayered lines, and the main line composing the power supply line 23 and the auxiliary line 25 may be made of one material selected among Al, Cu, and Ag. Note that, the power supply line 23 and the auxiliary line 25 may include more than one of the metals, or may be made of other material.

Figure 14:
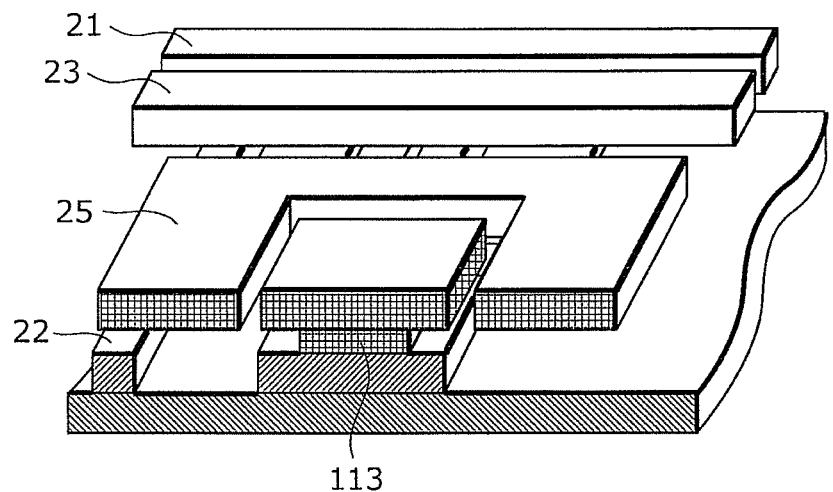
FIG. 14 is a perspective view of the thin film semiconductor device for display apparatus in FIG. 9.
Figure 15:
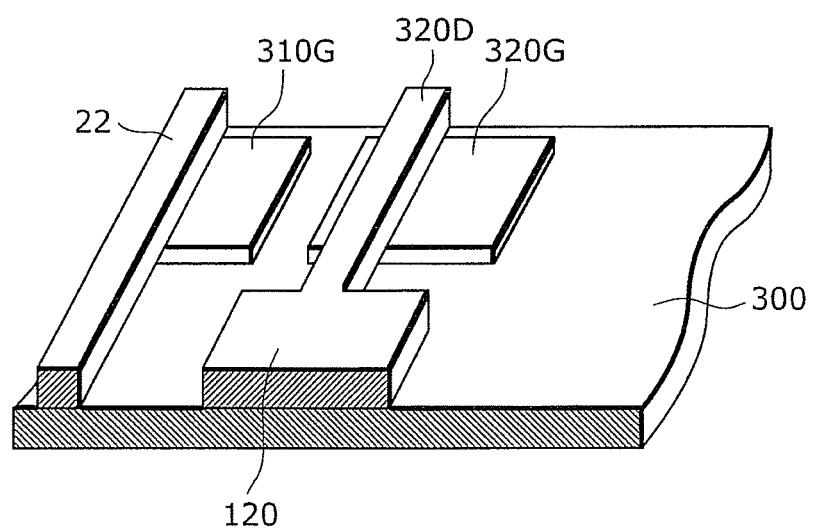
FIG. 15 is a perspective view of the thin film semiconductor device for display apparatus in FIG. 9.

FIG. 14 is a perspective view of the thin film semiconductor device for display apparatus 2 from an end of the side in which the electrode portion 120 is arranged. FIG. 15 is a perspective view of the thin film semiconductor device for display apparatus 2 from an end of the side in which the electrode portion 120 is arranged.

As illustrated in FIG. 14, the gate line 21, the power supply line 23, and the auxiliary line 25 are formed in the same layer. More specifically, the gate line 21, the power supply line 23, and the auxiliary line 25 are formed in the line layer L2 on the first interlayer insulating film 340, and in a layer different from the source line 22 which is formed in the TFT layer L1. Furthermore, the gate line 21, the power supply line 23 and the auxiliary line 25 are arranged orthogonal to the source line 22 and three-dimensionally cross each other. Furthermore, as illustrated in FIG. 15, the source line 22, the second source electrode 320S, and the second drain electrode 320D are formed in the TFT layer L1.

Figure 16A:
FIG. 16A is a cross-sectional view illustrating a manufacturing process of the EL display panel according to the first embodiment.

Next, the method of manufacturing the thin film semiconductor device for display apparatus 2 in the EL display panel 1 according to the first embodiment shall be described with reference to FIGS. 16A to 16J. Note that, FIGS. 16A to 163 are cross-sectional views schematically illustrating the method of manufacturing thin film semiconductor device for display apparatus according to the first embodiment of the present invention. Note that, the cross-sectional views of FIGS. 16A to 16J corresponds to the X2-X2' cross section in FIG. 9.

First, as illustrated in FIG. 16A, the substrate 300 is prepared. In general, insulating material made of glass, quartz and others are used for the substrate 300. An undercoat layer made of a silicon oxide film or silicon nitride film (not illustrated) may be formed to prevent impurity dispersion from the substrate 300. The thickness of the undercoat layer is approximately 100 nm, for example.

Figure 16B:
FIG. 16B is a cross-sectional view illustrating a manufacturing process of the EL display panel according to the first embodiment.

Next, after washing the substrate using purified water, for example, a heat-resistant first metal layer is formed above the substrate 300. Subsequently, as illustrated in FIG. 16B, the gate electrodes 310G and 320G are formed by patterning the first metal layer into a predetermined shape by photolithography, etching, and others. Any of heat resistant metal such as Mo, W, Ta, Ti, and Ni or their alloy may be used as the material for the first metal film. In this embodiment, Mo is used as an example, and the first metal film with the thickness approximately 100 nm is formed.

Figure 16C:
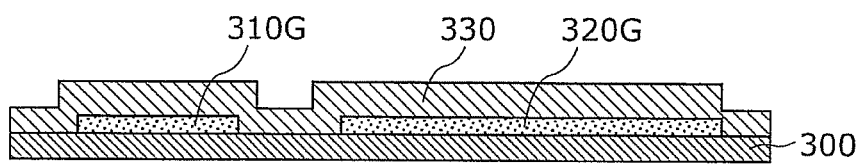
FIG. 16C is a cross-sectional view illustrating a manufacturing process of the EL display panel according to the first embodiment.

Next, as illustrated in FIG. 16C, the gate insulating film 330 is formed above the entire surface of the substrate 300 to cover the first gate electrode 310G and the second gate electrode 320G. Silicon oxide film ($SiO_2$), silicon nitride film (SiN), or a composite film of them may be used as the material for the gate insulating film 330. In this embodiment, the gate insulating film 330 with the thickness of approximately 200 nm is formed by plasma CVD.

Figure 16D:
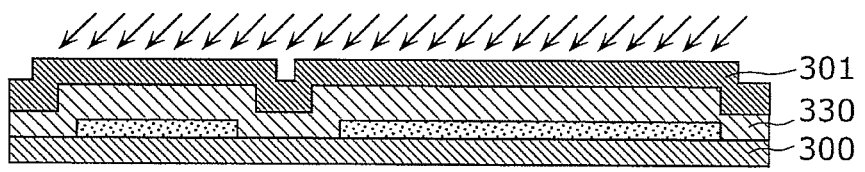
FIG. 16D is a cross-sectional view illustrating a manufacturing process of the EL display panel according to the first embodiment.

Subsequently, as illustrated in FIG. 16D, non-crystalline semiconductor film 301 is formed on the gate insulating film 330. In this embodiment, an amorphous silicon film is used as the non-crystalline semiconductor film 301, and the non-crystalline semiconductor film 301 is formed with a thickness of approximately 50 nm by plasma CVD. Note that, the gate insulating film 330 and the non-crystalline semiconductor film 301 are formed by continuous plasma CVD while maintaining a vacuum state.

Subsequently, as shown in the arrows in FIG. 16D, a polysilicon semiconductor film is obtained by irradiating laser such as excimer laser to crystallize the non-crystalline semiconductor film 301 to polysilicon semiconductor film. More specifically, by irradiating excimer laser and others on the amorphous silicon film to raise the temperature of the amorphous silicon film to a predetermined temperature range to crystallize the amorphous silicon film, and to increase the grain size to form the polysilicon semiconductor film, for example. Here, the predetermined temperature range is, for example, from 1100 to 1414 degrees Celsius. Furthermore, an average grain size of the polysilicon semiconductor layer is 20 nm to 60 nm.

Here, the first gate electrode 310G and the second gate electrode 320G are exposed to high temperature in the laser irradiating process. For this reason, it is preferable to form the first gate electrode 310G and the second gate electrode 320G with a metal having a melting point higher than the upper limit (1414 degrees Celsius) of the temperature range. On the other hand, lines and electrodes formed in the second metal layer ML2 and the third metal layer ML3 may be formed with the metal having a melting point lower than the lower limit of the temperature range (1100 degrees Celsius).

Note that, it is preferable to perform annealing at 400 to 500 degrees Celsius for 30 minutes as a pretreatment before irradiating laser. Furthermore, after irradiating laser, hydrogen plasma treatment in vacuum for a few seconds to a few dozens seconds is preferred.

Figure 16E:
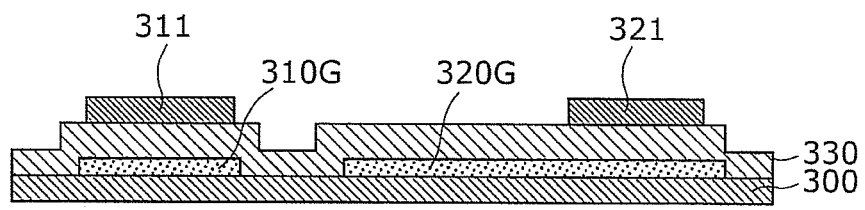
FIG. 16E is a cross-sectional view illustrating a manufacturing process of the EL display panel according to the first embodiment.

After that, as illustrated in FIG. 16E, the non-crystalline semiconductor film 301 is patterned in an island shape to form the first semiconductor layer 311 and the second semiconductor layer 321.

Figure 16F:
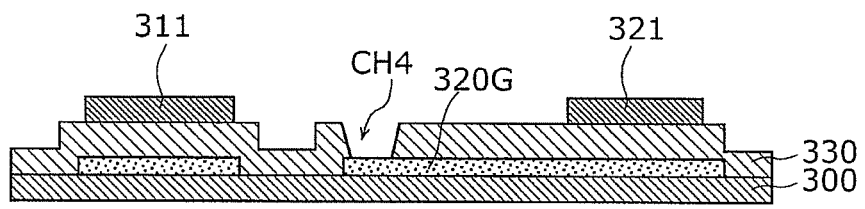
FIG. 16F is a cross-sectional view illustrating a manufacturing process of the EL display panel according to the first embodiment.

Next, as illustrated in FIG. 16F, the fourth contact hole CH4 through the gate insulating film 330 is formed by photolithography, wet etching, and others, to electrically connect the first drain electrode 310D and the second gate electrode 320G.

Figure 16G:
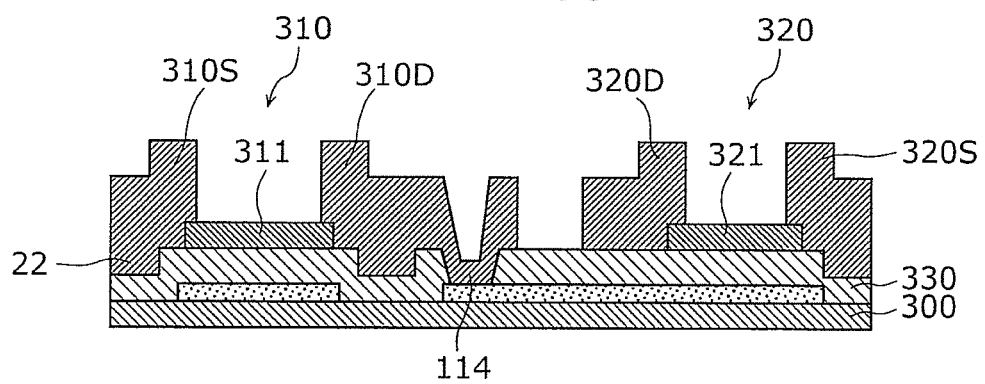
FIG. 16G is a cross-sectional view illustrating a manufacturing process of the EL display panel according to the first embodiment.

After that, as illustrated in FIG. 16G, the second metal film is formed to cover the gate insulating film 330, the first semiconductor layer 311 and the second semiconductor layer 321. Subsequently, the source line 22, the first source electrode 310S and the first drain electrode 310D, the second source electrode 320S, and the second drain electrode 320D are shaped by patterning the second metal film into a predetermined shape by photolithography, wet etching and others. Here, the fourth contact hole CH4 is filled with the material composing the second metal film, forming the fourth contact portion 114.

Note that, the material composing the second metal layer may be metal such as one of Al, Cu, and Ag, or alloys of these metals. In this embodiment, the second metal film made of Al with the thickness of approximately 300 nm is formed as an example.

In addition, it is preferable to form highly heat-resistant metal such as Mo is formed as a barrier metal on an upper side, lower side, or both of Al. The thickness of the barrier metal is approximately 50 nm. Furthermore, in a case where it is necessary to further lower the resistance of lines, it is preferable to use Cu instead of Al. Alternatively, increasing the thickness of the second metal film can lower the resistance, instead of changing the material.

Furthermore, it is preferable to form a low-resistance semiconductor film between the first source electrode 310S and the first semiconductor layer 311, and between the first drain electrode 310D and the first semiconductor layer 311. An amorphous silicon film in which n-type dopant such as Phosphorus is doped as impurity, or an amorphous silicon film in which p-type dopant such as Boron is doped as impurity is generally used for the low-resistance semiconductor film. The thickness of the low resistance semiconductor film is approximately 20 nm. Furthermore, an undoped (impurity is not intentionally doped) amorphous silicon semiconductor layer may be formed between the crystallized first semiconductor layer 311 and the low resistance semiconductor film (the amorphous silicon film in which impurity is doped) may be formed. Forming these films allows the desired TFT characteristics such as improvement in TFT characteristics. Note that the same applies to the second thin film transistor 320.

Figure 16H:
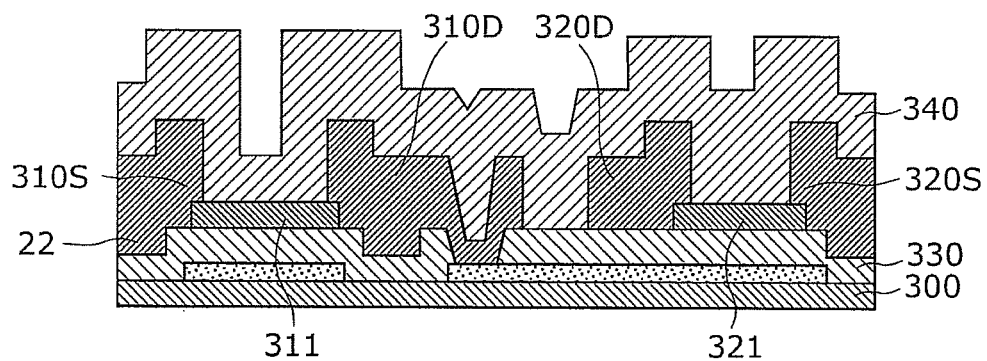
FIG. 16H is a cross-sectional view illustrating a manufacturing process of the EL display panel according to the first embodiment.

Next, as illustrated in FIG. 16H, the first interlayer insulating film 340 is formed above the entire surface of the substrate 300 to cover exposed electrodes and lines such as the first source electrode 310S, the first drain electrode 310D, the second source electrode 320S and the second drain electrode 320D. The first interlayer insulating film 340 may be formed with a silicon oxide film, a silicon nitride film, or a laminated film of these films.

Figure 16I:
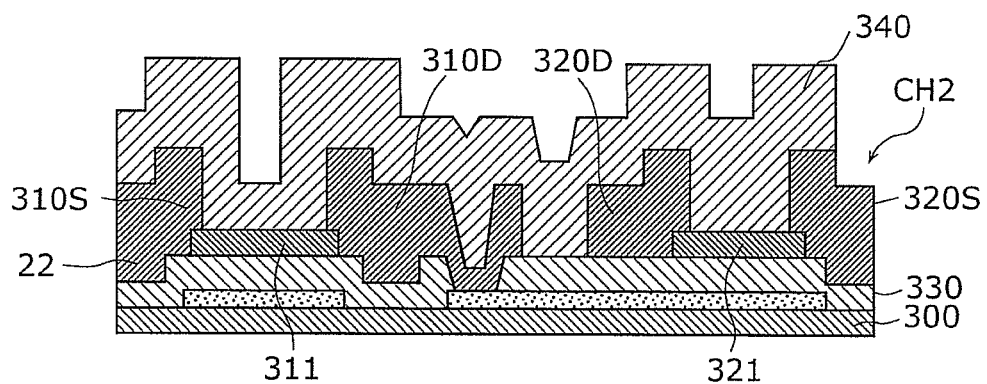
FIG. 16I is a cross-sectional view illustrating a manufacturing process of the EL display panel according to the first embodiment.

Subsequently, as illustrated in FIG. 16I, the second contact hole CH2 through the first interlayer insulating film 340 to connect the power supply line 23 and the second source electrode 320S by photolithography, etching, and others. Here, the first contact hole continuously passes through the first interlayer insulating film 340 and the gate insulating film 330 to connect the first gate electrode 310G and the gate line 21 is also formed.

Figure 16J:
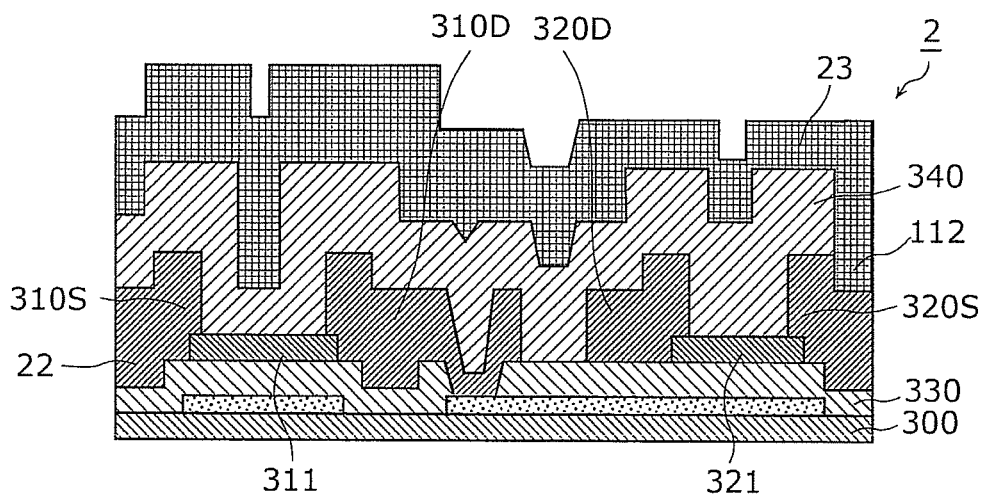
FIG. 16J is a cross-sectional view illustrating a manufacturing process of the EL display panel according to the first embodiment.

Next, as illustrated in FIG. 16J, the third metal film is formed above the first interlayer insulating film 340, and the gate line 21, the power supply line 23 and the auxiliary line 25 are formed by patterning the third metal film into a predetermined shape by photolithography and etching, for example. Here, the second contact hole CH2 and the first contact hole (see FIG. 11) are filled with the material composing the third metal film, forming the second contact portion 112 and the first contact portion 111.

Note that, the material of the third metal film composing the gate line 21, the power supply line 23, and the auxiliary line 25 is preferably low resistance, and can be made of the metal same as the second metal layer. For example, the third metal film can be formed by forming 300 nm of Al after forming 50 nm of Mo as a barrier metal.

The thin film semiconductor device for display apparatus 2 according to the first embodiment of the present invention is manufactured as described above.

After that, as illustrated in FIG. 13, the second interlayer insulating film 250 is formed above the first interlayer insulating film 340 to cover the gate line 21, the power supply line 23, and the auxiliary line 25. The second interlayer insulating film 350 may be formed of the material same as the first interlayer insulating film 340. For example, a silicon oxide film, a silicon nitride film, or a laminated film of these films may be used.

Subsequently, the organic EL layer L3 illustrated in FIG. 4 is formed on the second interlayer insulating film 350. More specifically, the lower electrodes 12, the ban 15, the organic EL layer 13, and the upper electrode 14 are sequentially formed above the second interlayer insulating film 350.

First, a contact hole (not illustrated) passing through the second interlayer insulating film 350 is formed by photolithography and etching. The contact hole is the first contact portion 115 illustrated in FIG. 13.

Next, the lower electrode 12 is formed above the second interlayer insulating film 350. The bank 15 is formed in a position corresponding to the boundary of the pixels 15 above the second interlayer insulating film 350. Furthermore, the organic EL layer 13 is formed above the lower electrode 12 for each pixel 100 in the opening of the bank 15.

The upper electrode 14 is formed above the second interlayer insulating film 350 to cover the bank 15 and the organic EL layer 13. Here, the contact hole formed in the second interlayer insulating film 350 is filled with the material composing the upper electrode 14, forming the fifth contact portion 115. The upper electrode 14 and the auxiliary line 25 are electrically connected through the fifth contact portion 115.

The material composing the lower electrode 12 is any of conductive metal such as Mo, Al, Au, Hg, Cu, and others, an alloy of these metals, organic conductive material such as PEDOT:PSS, Zinc Oxide, or lead added Indium Oxide. The film made of the material is used for making an electrode pattern by vapor deposition, electron beam deposition, RF sputtering, or printing method.

The organic EL layer 13 is formed for each color (sub-pixel column) or for each sub-pixel in the opening of the bank 15 on the lower electrode 12. The organic EL layer 13 is formed by stacking layers such as the hole injection layer, the hole transport layer, the light-emitting layer, the electron transport layer, and the electron injecting layer. For example, copper phthalocyanine may be used as the hole injection layer, α-NPD(Bisbenzidine) may be used as the hole transport layer, $Alq_3$(tris(8-hydroxyquinoline)aluminum) may be used as the light-emitting layer, oxazole derivative may be used as the electron transport layer, and $Alq_3$ may be used as the electron injecting layer. Note that, these materials are merely an example, and other materials may be used.

The upper electrode 14 is a transmissive electrode continually formed on the organic EL layer 13. The material composing the upper electrode 14 is Indium Tin Oxide (ITO), $SnO_2$, $In_2O_3$, ZnO or a combination of them.

As such, the EL display panel 1 according to the first embodiment of the present invention is manufactured.

According to the EL display panel 1 of the first embodiment of the present invention, the gate line 21 of the thin film semiconductor device for display apparatus 2 in the EL display panel 1 is formed in the line layer L2 above the first interlayer insulating film 340, and is arranged in a separate layer (different layer) from the first gate electrode 310G (and the second gate electrode 320G). With this, material suitable for the gate line 21 and the first gate electrode 310G (and the second gate electrode 320G) can be selected separately.

In addition, according to the EL display panel 1 of this embodiment, the power supply line 23 is formed in the same layer as the gate line 21 above the first interlayer insulating film 340, and side-by-side with the gate line 21. In addition, the auxiliary line 25 is formed in the same layer as the gate line 21 and the power supply line 23, and the above the first interlayer insulating film 340, and arranged side-by-side with the gate line 21 and the power supply line 23. With this, it is possible to fill the depressed portion of the unevenness formed by arranging the gate line 21 on the first interlayer insulating film 340 with the power supply line 23 and the auxiliary line 25. More specifically, the power supply line 23 and the auxiliary line 25 can reduce the unevenness on the first interlayer insulating film 340, improving the flatness of the upper surface of the thin film semiconductor device for display apparatus 2. As a result, when forming the line layer L2 or the organic EL layer L3 on the thin film semiconductor device for display apparatus 2, the effect on the line layer L2 or the organic EL layer L3 caused by the unevenness on the first interlayer insulating film 340 can be reduced. Thus, it is possible to suppress the reduction in product life that occurs when the surface is not sufficiently flat.

Furthermore, in the thin film semiconductor device for display apparatus 2, the power supply line 23 is formed to cover the first semiconductor layer 311 and the second semiconductor layer 321 as illustrated in FIG. 12. Thus, it is preferable to form both the first semiconductor layer 311 and the second semiconductor layer 321 to be of P-channel type.

In the semiconductor layer (channel region) of the thin film transistor, lattice defect may occur at the time of manufacturing on the surface of the semiconductor layer and on the surface of the interlayer insulating film covering the thin film transistor. When the lattice defect occurs, there is an unstable interface state, causing the electric potential of the back channel of the semiconductor layer to be unstable.

In the first embodiment, the P-channel first semiconductor layer 311 and the second semiconductor layer 321 are formed to overlap the power supply line 23 having the positive electric potential. With this, it is possible to stabilize the electric potential in the back channel.

Figure 17:
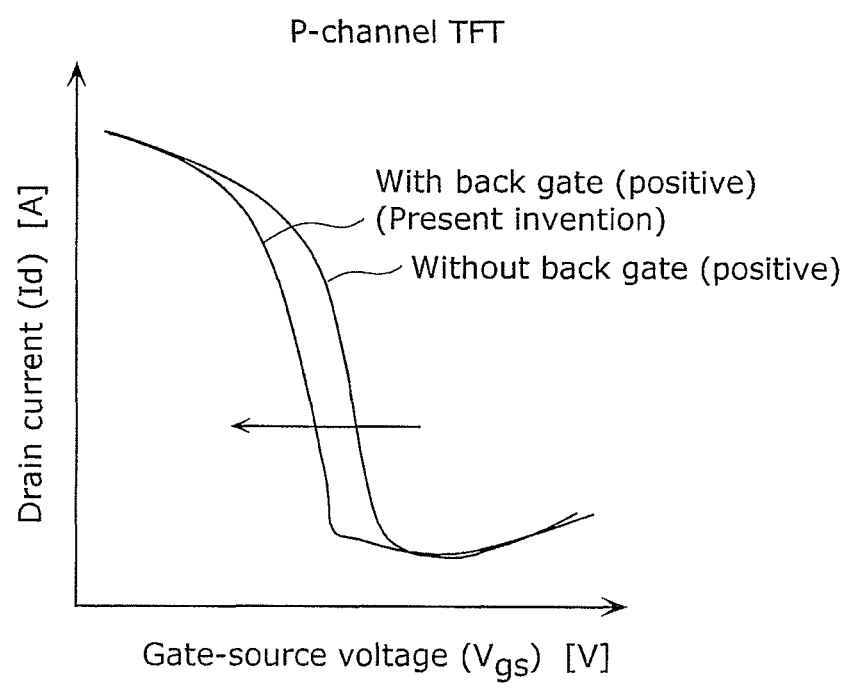
FIG. 17 is a diagram for describing TFT characteristics of thin film transistors in the thin film semiconductor device for display apparatus according to the first embodiment of the present invention.

FIG. 17 is a diagram for describing TFT characteristics of thin film transistors in the thin film semiconductor device for display apparatus according to the first embodiment of the present invention. In the first embodiment, the P-channel first semiconductor layer 311 and the second semiconductor layer 321 are formed to overlap the power supply line 23 having the positive electric potential, forming a P-channel TFT with a back gate. With this, it is possible to stabilize the electric potential in the back channel. Consequently, as illustrated in FIG. 17, in the first thin film transistor 310 and the second thin film transistor 320 which are P-channel TFT with back gate, it is possible to produce effects such as suppressing the leakage current when the transistor is OFF (off-leakage current) at a level equivalent to the P-channel TFT without back gate, and reducing the effect of external noise. This is because the back gate covering above the channel region serves as a shield for the electromagnetic wave by the external noise. Therefore, it is possible to implement the thin film semiconductor device for display apparatus including the thin film transistor with good off characteristics and highly resistant to external noise.

In addition, in the thin film semiconductor device for display apparatus 2 according to the first embodiment, the power supply line 23 and the auxiliary line 25 are formed with a level substantially identical to the gate line 21, that is, at a level same as or within an approximate value from the gate line 21, and it is preferable to form the power supply line 23 and the auxiliary line 25 to have a width, in combination, corresponding to the width between the two adjacent gate lines 21. Furthermore, it is preferable that the distance from the power supply line 23 or the auxiliary line 25 to the two adjacent gate lines 21, that is the distance from the gate line 21 and the power supply line 23, the distance between the power supply line 23 and the auxiliary line 25, and the distance between the auxiliary line 25 and the gate line 21 are 4 μm or more.

In this embodiment, the gate line 21 is formed above the first interlayer insulating film 340. Thus, without any adjustment, the region in which the gate line 21 is formed protrudes from the region in which the gate line 21 is not formed as much as the thickness of the gate line 21, forming a depressed portion between adjacent gate lines 21.

In response to this problem, by arranging the power supply line 23 and the auxiliary line 25 at a substantially same level as the gate line 21, and the power supply line 23 and the auxiliary line 25 to have the width corresponding to the interval between the two adjacent gate lines 21, it is possible to ensure flatness of the upper surface of the thin film semiconductor device for display apparatus 2 by the power supply line 23 and the auxiliary line 25. With this, in forming the organic EL device 10, it is possible to easily prevent the reduced life of the organic EL device 10 caused by insufficient flatness on the upper surface of the line layer L2.

In addition, in the thin film semiconductor device for display apparatus 2 according to this embodiment, the power supply line 23 and the auxiliary line 25 are preferably formed at a level substantially equal to the gate line 21 and next to the two adjacent gate lines 21 to fill the interval between the two adjacent gate lines 21.

With this, the depressed portion between the adjacent gate lines 21 is buried by the power supply line 23 and the auxiliary line 25, thereby securing flatness on the upper surface of the thin film semiconductor device for display apparatus 2. Furthermore, it is possible to lower the resistance of the power supply line 23 and the auxiliary line 25.

Variation of the First Embodiment

Figure 18:
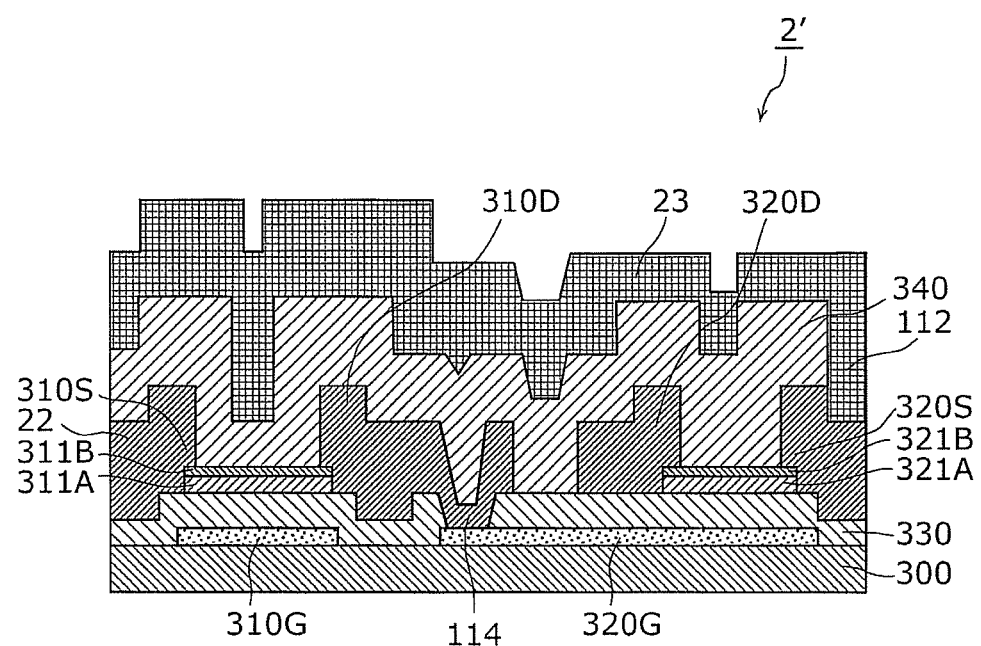
FIG. 18 is a cross-sectional view of the thin film semiconductor device for display apparatus in the EL display panel according to the first embodiment of the present invention.

Next, the thin film transistor device for display apparatus 2' in the EL display panel according to a variation of the first embodiment of the present invention shall be described with reference to FIG. 18. FIG. 18 is a cross-sectional view of the EL display panel 2' provided in the EL display panel according to this variation. Note that, FIG. 18 corresponds to FIG. 12, a cross sectional view of the thin film semiconductor device for display apparatus 2 in the EL display panel according to the first embodiment of the present invention.

The thin film semiconductor device for display apparatus 2' has the same basic configuration as the thin film semiconductor device for display apparatus in the EL display panel 1 according to the first embodiment of the present invention. Accordingly, in FIG. 18, the same reference numerals are assigned to the components identical to the components illustrated in FIG. 12, and detailed description for these components are omitted or simplified. Furthermore, the configuration other than the illustration in FIG. 12 is identical to the first embodiment.

The configurations of the first semiconductor layer in the first thin film transistor 310 and the second semiconductor layer in the second thin film transistor 320 in the thin film semiconductor device for display apparatus 2' according to this variation are different from the thin film semiconductor device for display apparatus 2 according to the first embodiment of the present invention.

As illustrated in FIG. 18, in the thin film semiconductor device for display apparatus 2' according to this variation, the first semiconductor layer in the first thin film transistor 310 includes a first channel layer 311A composed of a polycrystalline semiconductor film and a second channel layer 311B composed of a non-crystalline semiconductor film. The second semiconductor layer in the second thin film transistor 320 also includes a first channel layer 321A composed of a polycrystalline semiconductor film and a second channel layer 321B composed of a non-crystalline semiconductor film.

The first channel layer 311A and the first channel layer 321A can be composed of a polycrystalline semiconductor film formed by crystallizing an amorphous silicon film.

The second channel layer 311B and the second channel layer 321B can be composed of an amorphous semiconductor film in the same manner as the first semiconductor layer 311 and the second semiconductor layer 321 illustrated in FIG. 12.

The first semiconductor layer and the second semiconductor layer can be formed by crystallizing the upper layer of the amorphous silicon film through laser irradiation. In planar view, the first channel layer 311A (or the first channel layer 321A) and the second channel layer 311B (or the second channel layer 321B) have the same shape, and are formed in an island-shape on the gate insulating film 330.

The thin film semiconductor device for display apparatus 2' according to this variation can achieve the same effects as the thin film semiconductor device for display apparatus in the EL display panel 1 according to the first embodiment of the present invention.

Furthermore, in the thin film semiconductor device for display apparatus 2', the first semiconductor layer and the second semiconductor layer in thin film transistor are formed such that the first channel layer 311A composed of the polycrystalline semiconductor film (or the first channel layer 321A) is formed under the second channel layer 311B (or the second channel layer 321B) composed of the amorphous silicon film. With this, in the first thin film transistor and the second thin film transistor, it is possible to reduce the off current, and to increase the on current.

Second Embodiment

Figure 19:
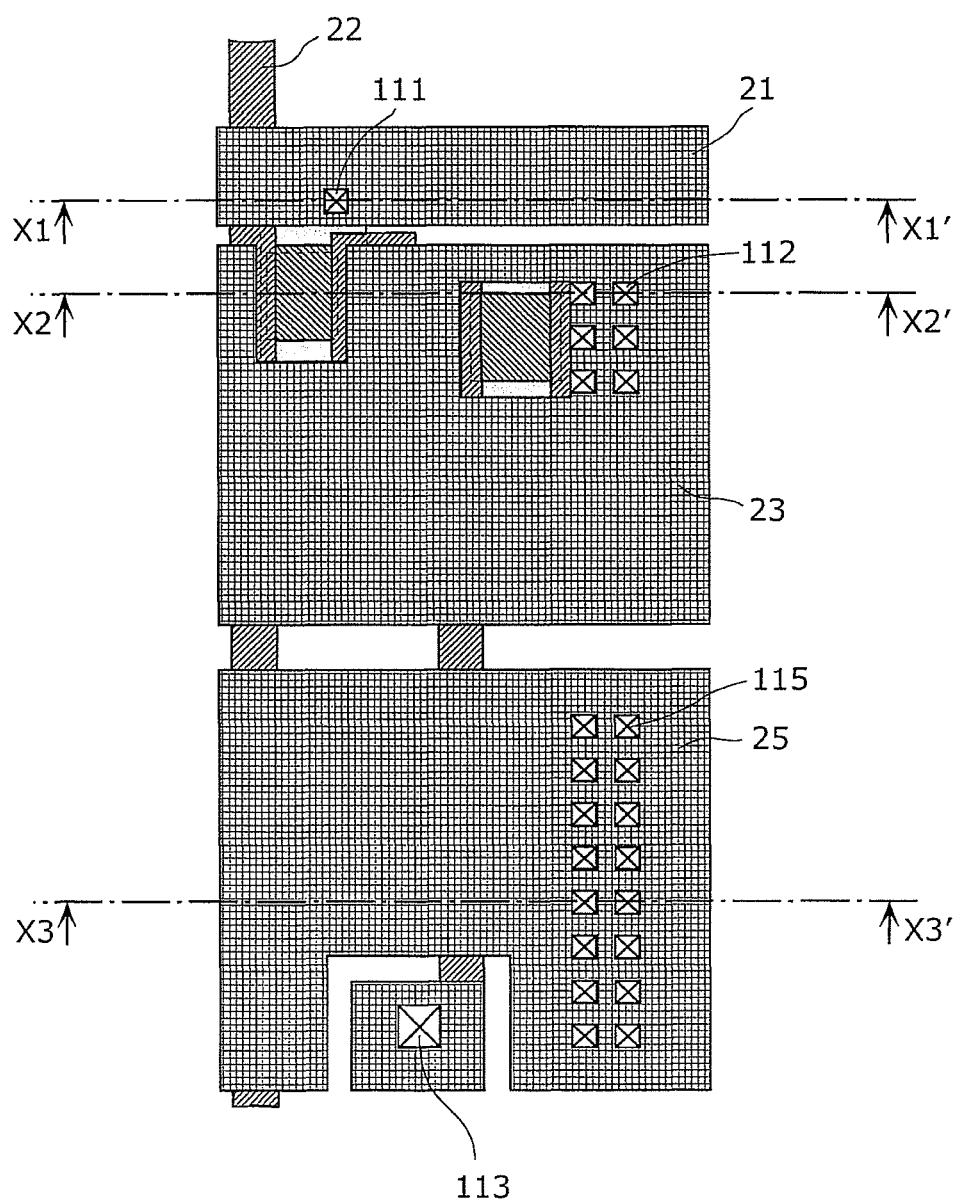
FIG. 19 is a planar view of the thin film semiconductor device for display apparatus in the EL display panel according to the second embodiment of the present invention.
Figure 20:
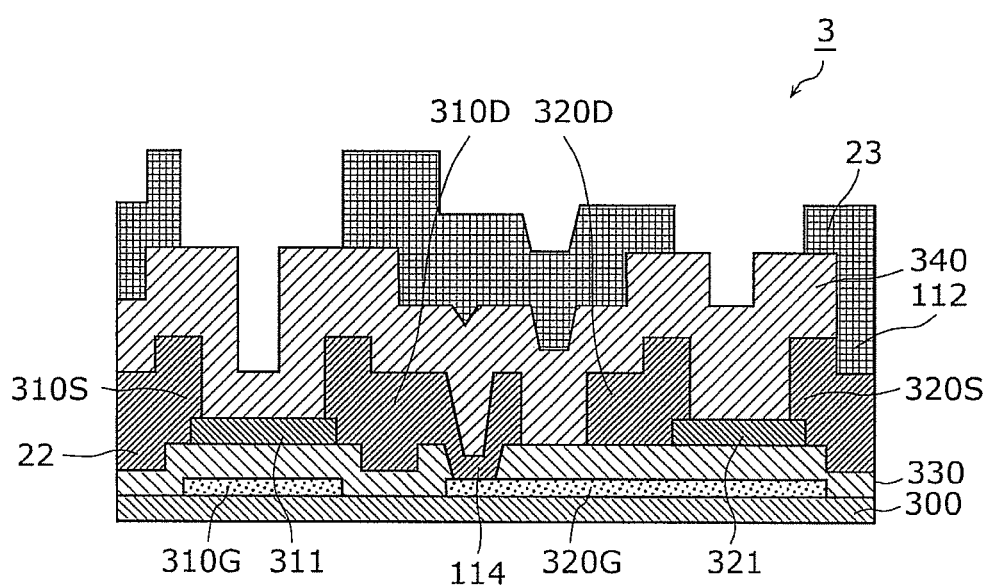
FIG. 20 is a cross-sectional view of the thin film semiconductor device for display apparatus in the EL display panel according to the second embodiment of the present invention (a cross-sectional view along X2-X2' in FIG. 19).
Figure 21:
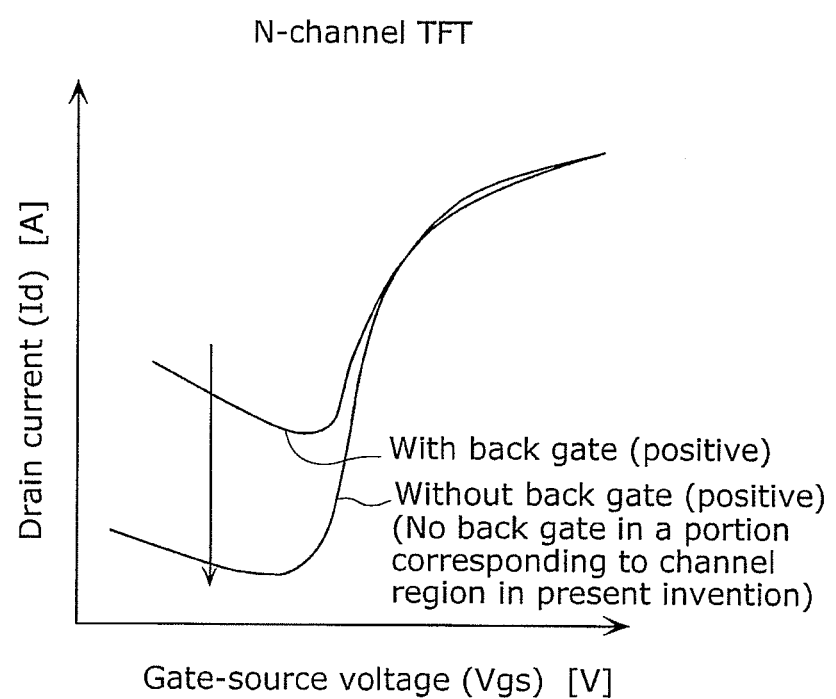
FIG. 21 is a diagram for describing TFT characteristics of thin film transistors in the thin film semiconductor device for display apparatus according to the second embodiment of the present invention.

The following describes the circuit configuration of the pixel in the EL display panel according to the second embodiment of the present invention with reference to FIGS. 19 to 21. FIG. 19 is a planar view of the thin film semiconductor device for display apparatus provided in the EL display panel according to the second embodiment of the present invention. FIG. 20 is a cross sectional view of the thin film semiconductor device for display apparatus along X2-X2' in FIG. 19. FIG. 21 is a diagram for describing TFT characteristics of thin film transistors in the thin film semiconductor device for display apparatus according to the first embodiment of the present invention.

The thin film semiconductor device for display apparatus 3 in the EL display panel according to the second embodiment of the present invention has the same basic configuration as the thin film semiconductor device for display apparatus 2 in the EL display panel according to the first embodiment of the present invention. Accordingly, in FIGS. 19 and 20, the same reference numerals are assigned to the components identical to the components illustrated in FIGS. 8 to 13, and detailed description for these components are omitted or simplified.

The thin film semiconductor device for display apparatus 3 is different from the thin film semiconductor device for display apparatus 2 according to the first embodiment of the present invention in that the channel type of the first semiconductor layer 311 and the second semiconductor layer 312 is N-channel type, and the source electrode and the drain electrode in the first embodiment are the drain electrode and the source electrode, respectively, in the second embodiment, and the configuration of the power supply line 23 is different Note that the rest of the configuration is identical to the first embodiment.

As illustrated in FIGS. 19 and 20, in the thin film semiconductor device for display apparatus 3, the power supply line 23 is arranged not to overlap the first semiconductor layer 311 and the second semiconductor layer 321, and includes a first opening 131 formed above the first semiconductor layer 311 and a second opening 132 formed above the second semiconductor layer 321.

Both the first semiconductor layer 311 and the second semiconductor layer 321 are of N-channel type.

The thin film semiconductor device for display apparatus 3 can be manufactured in the same manner as in the first embodiment. However, in this embodiment, it is necessary to form the first opening 131 and the second opening 132 in the power supply line 23. The first opening 131 and the second opening 132 are formed in the power supply line 23 at the time of patterning the third metal film.

As such, according to the thin film semiconductor device for display apparatus 3, in the same manner as the first embodiment, it is possible to form the gate lines 21 and the first gate electrodes 310G as separate layers. Thus, it is possible to select material suitable for each layer.

Furthermore, the power supply lines 23 and the auxiliary lines 25 are formed in the same layer as the gate lines 21 and are arranged side-by-side with the gate lines 21, thereby reducing the unevenness on the first interlayer insulating film 340 due to the gate line 21, and improving the flatness.

Furthermore, the thin film semiconductor device for display apparatus 3 achieves the following effects.

When the power supply line 23 with positive electric potential covers the first interlayer insulating film 340 above the first semiconductor layer 311 and the second semiconductor layer 321 of N-channel type, negative carriers are induced at the back channel of the first semiconductor layer 311 and the second semiconductor layer 321, generating off-leakage current. Therefore, a current is generated without applying the gate voltage. As a result, the OFF characteristics of the first thin film transistor 310 and the second thin film transistor 320 are decreased.

In contrast, in the thin film semiconductor device for display apparatus 3 according to this embodiment, the semiconductor layer 311 and the second semiconductor layer 321 of N-channel type are arranged not to overlap the second power supply line 23 with positive electric potential. That is, there is no back gate. As a result, as illustrated in FIG. 21, with regard to the first thin film transistor 310 and the second thin film transistor 320 which are the N-channel TFTs without back gate, the power supply line 23 suppresses the induced carriers at the back channel, compared to the N-channel TFT with a back gate. As a result, it is possible to reduce the off-leakage current at the first thin film transistor 310 and the second thin film transistor 320. Therefore, it is possible to implement the EL display panel 2 with thin film transistors with good OFF characteristics.

Variation of the Second Embodiment

Figure 22:
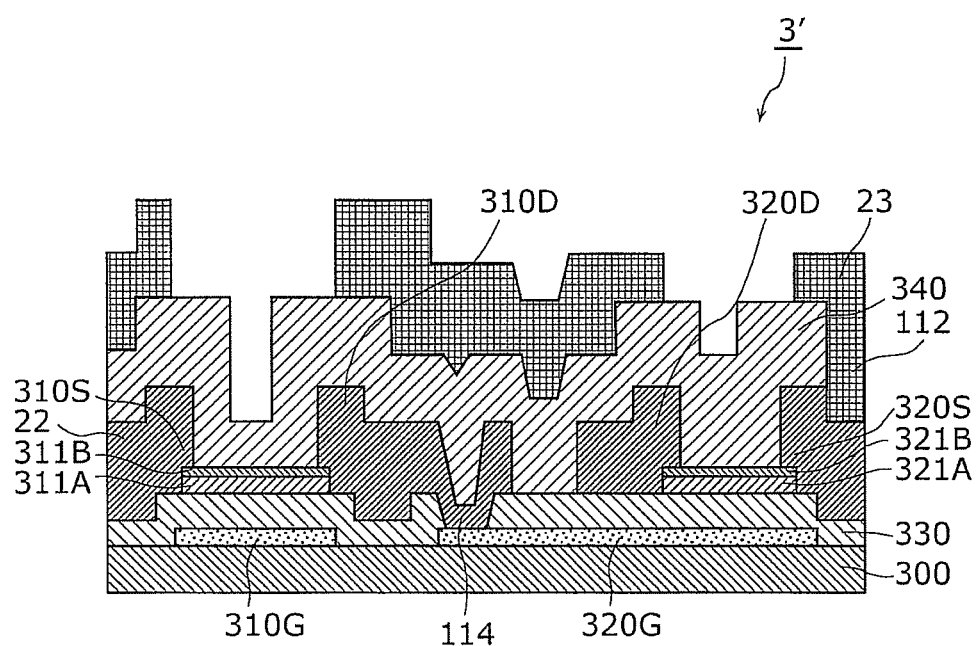
FIG. 22 is a cross-sectional view of the thin film semiconductor device for display apparatus in the EL display panel according to a variation of the second embodiment of the present invention.

The following describes the EL display panel according to the second embodiment of the present invention with reference to FIG. 22. FIG. 22 is a cross-sectional view of the thin film semiconductor device for display apparatus 3' provided in the EL display panel according to the variation of the second embodiment of the present invention. Note that, FIG. 22 corresponds to FIG. 20, a cross sectional view of the thin film semiconductor device for display apparatus 3 in the EL display panel according to the second embodiment of the present invention.

The thin film semiconductor device for display apparatus 3' has the same basic configuration as the thin film semiconductor device for display apparatus 3 according to the second embodiment of the present invention. Accordingly, in FIG. 22, the same reference numerals are assigned to the components identical to the components illustrated in FIG. 20, and detailed description for these components are omitted or simplified. Furthermore, the configuration other than the illustration in FIG. 22 is identical to the second embodiment.

The configurations of the first semiconductor layer in the first thin film transistor 310 and the second semiconductor layer in the second thin film transistor 330 in the thin film semiconductor device for display apparatus 3' are different from the thin film semiconductor device for display apparatus 3.

As illustrated in FIG. 22, in the thin film semiconductor device for display apparatus 3' according to this variation, the first semiconductor layer in the first thin film transistor 310 includes a first channel layer 311A composed of a polycrystalline semiconductor film and a second channel layer 311B composed of a non-crystalline semiconductor film. The second semiconductor layer in the second thin film transistor 320 also includes a first channel layer 321A composed of a polycrystalline semiconductor film and a second channel layer 321B composed of a non-crystalline semiconductor film.

The first channel layer 311A and the second channel layer 321A can be composed of a polycrystalline silicon film formed by crystallizing an amorphous silicon film.

The second channel layer 311B and the second channel layer 321B are composed of non-crystalline semiconductor film.

The first semiconductor layer and the second semiconductor layer with the configuration above can be formed by forming the amorphous silicon film on the crystallized amorphous silicon film which was crystallized by irradiating laser. In planar view, the first channel layer 311A (or the first channel layer 321A) and the second channel layer 311B (or the second channel layer 321B) have the same shape, and are formed in an island-shape above the gate insulating film 330.

The EL display panel according to this variation can achieve the same effects as the EL display panel including the thin film semiconductor device for display apparatus 3 according to the second embodiment of the present invention.

Furthermore, in the thin film semiconductor device for display apparatus 3', the first semiconductor layer and the second semiconductor layer in thin film transistor are formed such that the first channel layer 311A composed of the polycrystalline semiconductor film (or the first channel layer 321A) is formed under the second channel layer 311B (or the second channel layer 321B) composed of the amorphous silicon film. With this, in the first thin film transistor and the second thin film transistor, it is possible to reduce the off current, and to increase the on current.

Note that the present invention is not limited to the embodiments described above, and maybe modified or changed within the scope of the present invention.

Figure 23A:
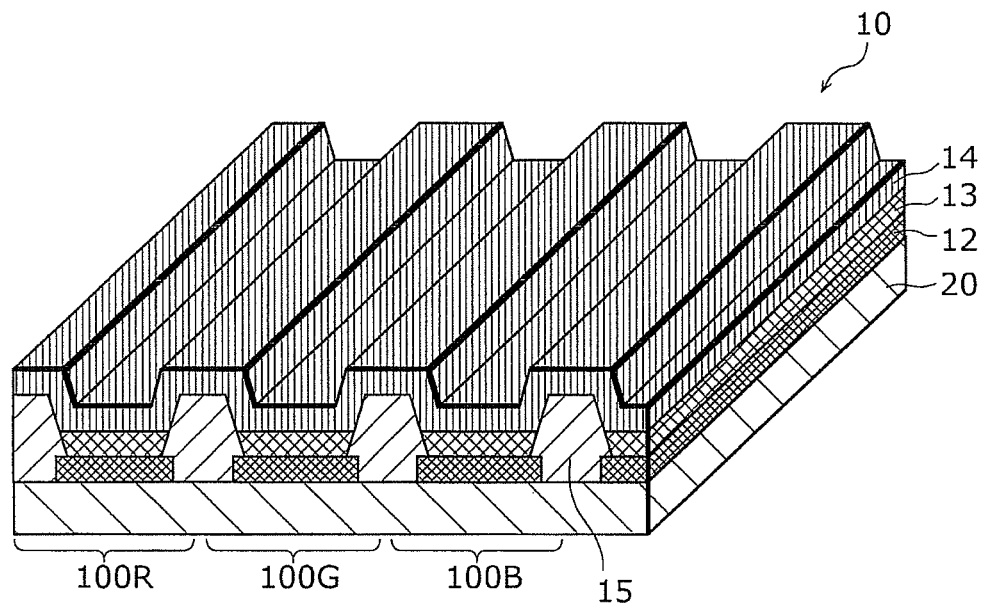
FIG. 23A is a cross-sectional perspective view illustrating an example of the EL display panel according to the present invention.
Figure 23B:
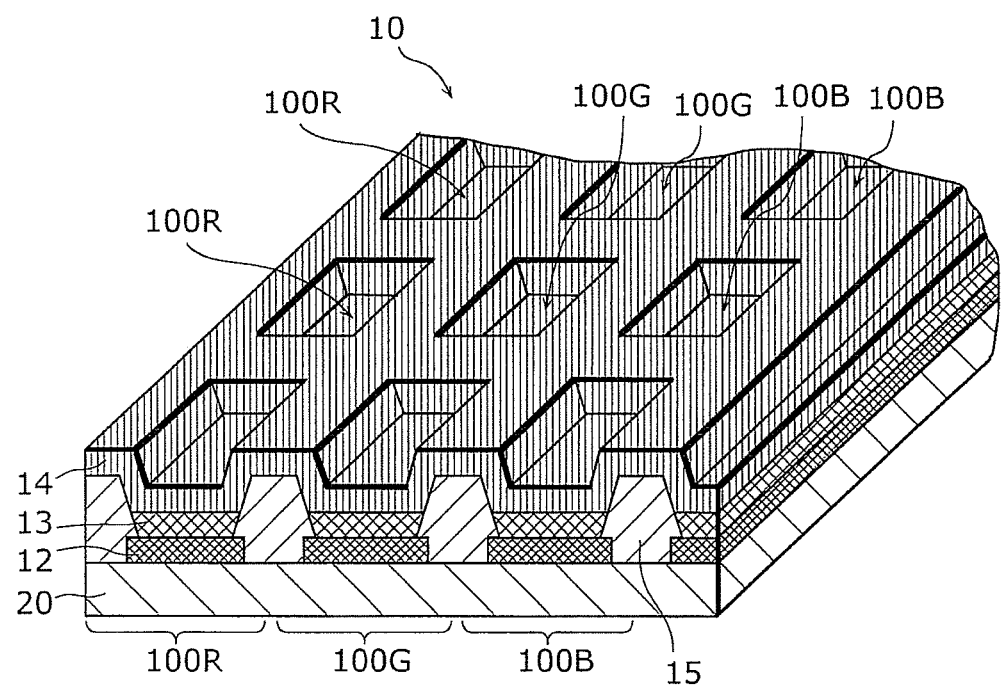
FIG. 23B is a cross-sectional perspective view illustrating another example of the EL display panel according to the present invention.
Figure 24:
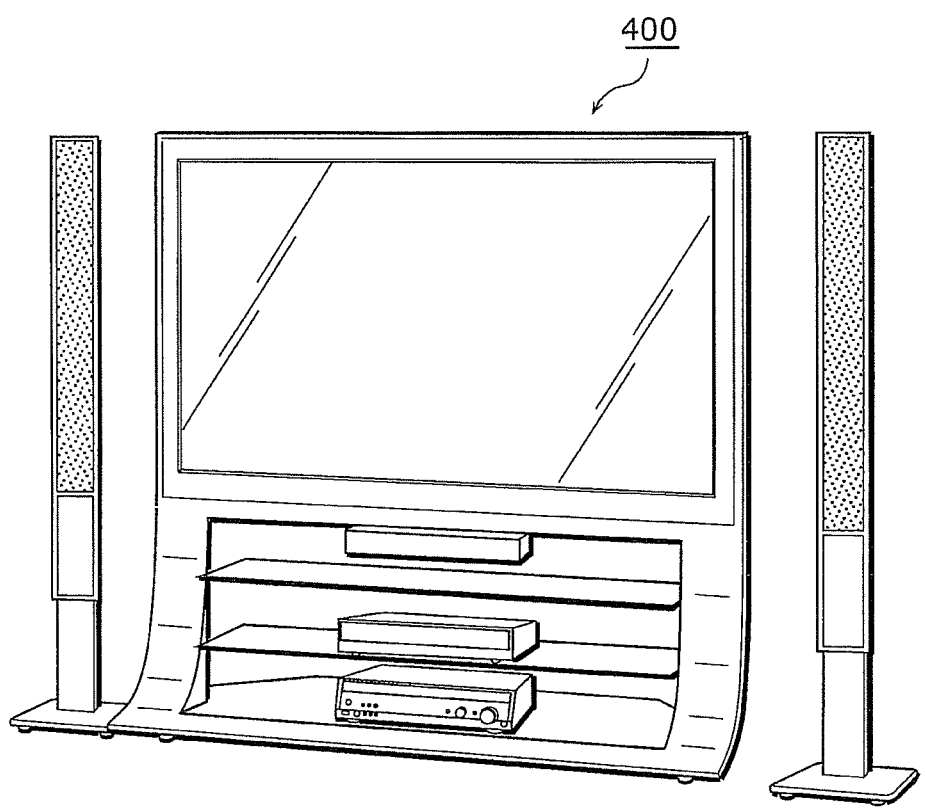
FIG. 24 is an external perspective view illustrating an example of the EL display apparatus according to the present invention.
Figure 25:
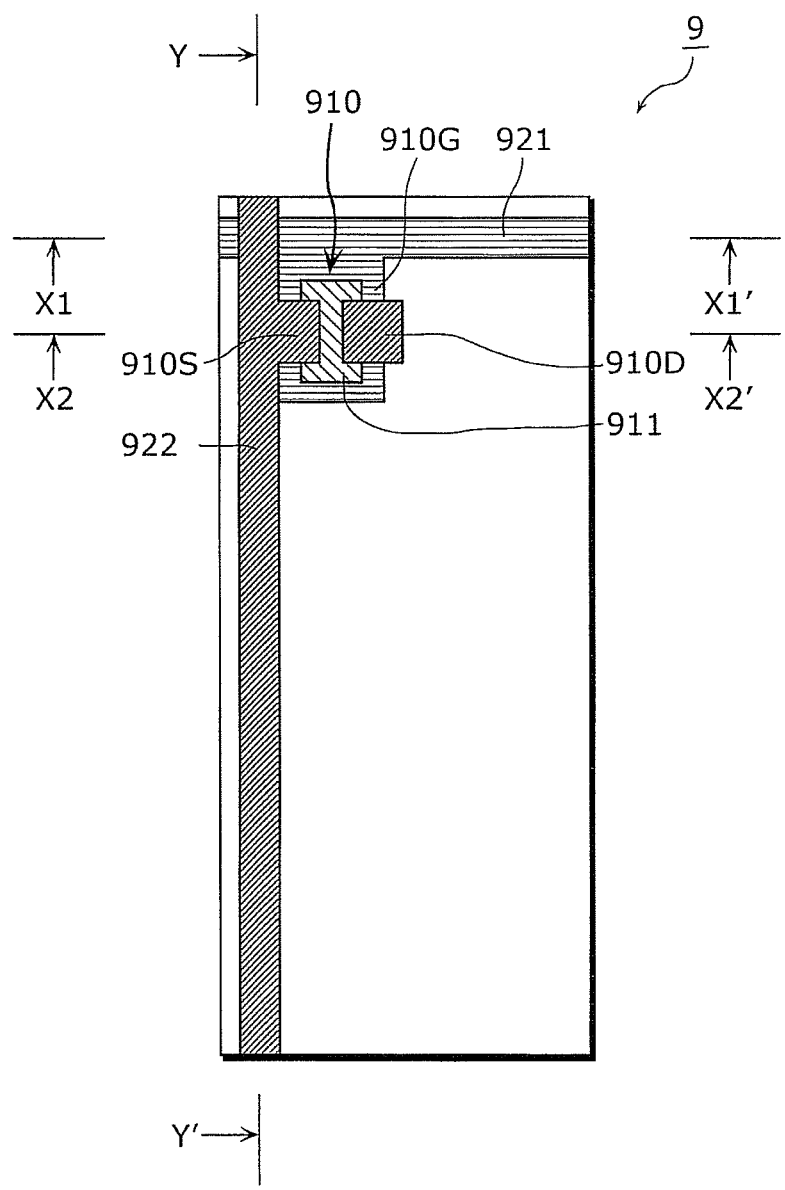
FIG. 25 is a planar view of the thin film semiconductor device for display apparatus for one pixel of the display apparatus.
Figure 26A:
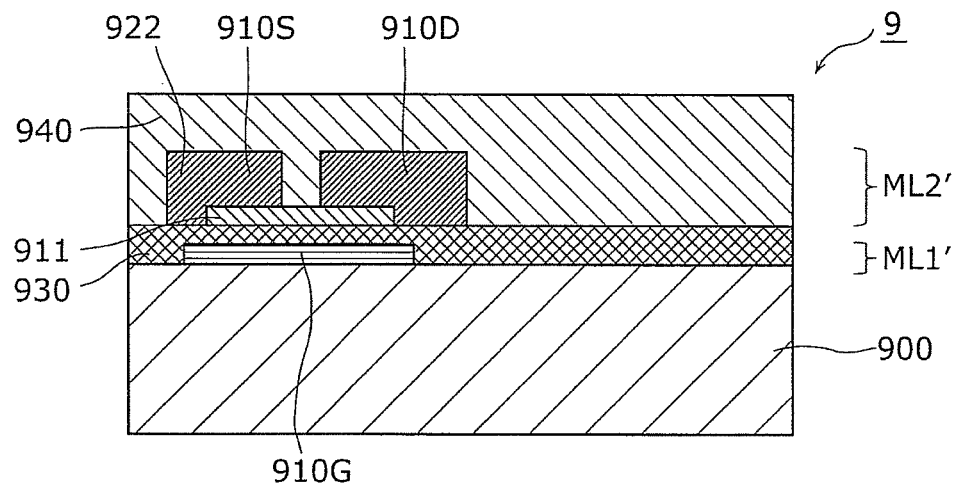
FIG. 26A is a cross-sectional view of the conventional thin film semiconductor device for display apparatus (a cross-sectional view along X1-X1' in FIG. 25)
Figure 26B:
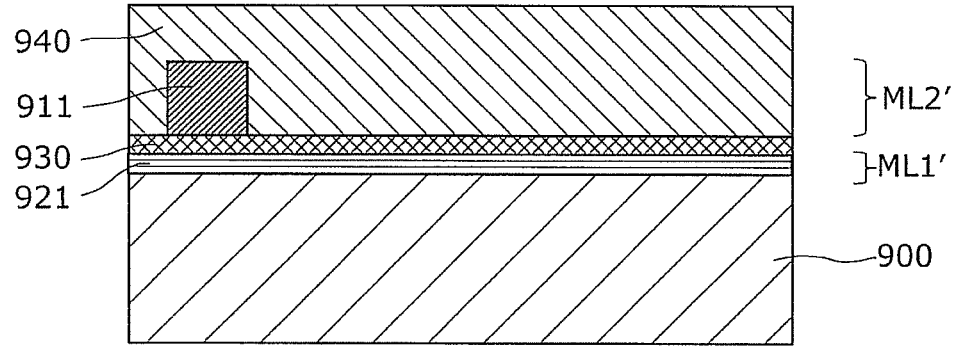
FIG. 26B is a cross-sectional view of the conventional thin film semiconductor device for display apparatus (a cross-sectional view along X2-X2' in FIG. 25)
Figure 26C:
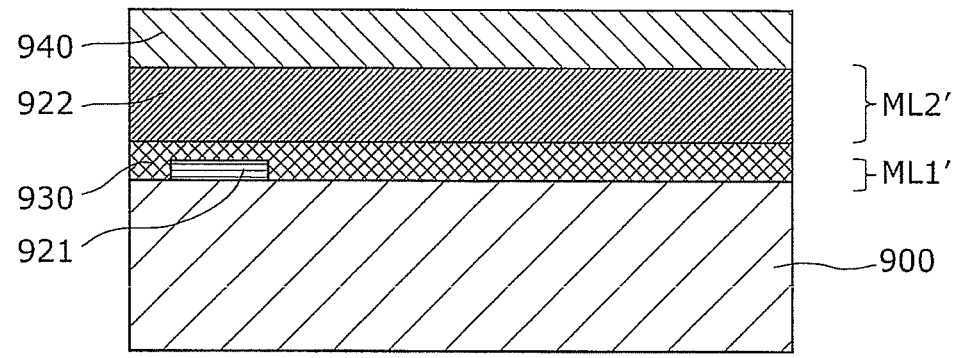
FIG. 26C is a cross-sectional view illustrating the conventional thin film semiconductor device for display apparatus (a cross-sectional view along Y-Y' in FIG. 25)
Figure 27:
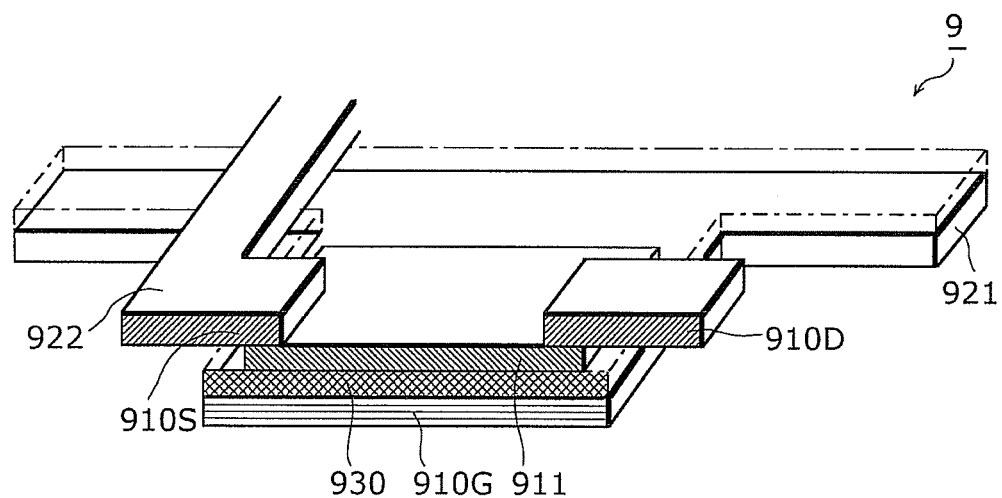
FIG. 27 is a perspective view illustrating the conventional thin film semiconductor device for display apparatus seen in a cross-section along X1-X1' in FIG. 25.

For example, the pixels 100 in the organic EL display panel 1 may be composed of sub pixels 100R, 100G, and 100B in three colors (red, green, and blue) as illustrated in FIGS. 23A and 23B. Multiple sub-pixels 100R, 100G, and 100B are arranged in a depth direction of the FIG. 23A (referred to as sub-pixel columns).

FIG. 23A illustrates an example of line banks. As illustrated in FIG. 23A, the sub-pixel columns are separated by the banks 15 for each sub-pixel column. The banks 15 illustrated in FIG. 23A are protrusions extending between adjacent sub-pixel columns in a direction in parallel with the source lines 22, and are formed above the thin film semiconductor array device 20. In other words, each sub-pixel column is formed in a gap between the adjacent protrusions (that is, opening of the banks 15).

Each of the lower electrodes 12 is formed above the thin film semiconductor array device 20 (more specifically, above the upper interlayer insulating film 11) and in the opening of the bank 15 for each sub-pixel 100R, 100G, or 100B. The organic EL layer 13 is formed in the opening of the bank 15 and on the lower electrode 12 for each sub-pixel column (that is, covering the lower electrodes 12 in each column). The upper electrode 14 is continuously formed on the organic light-emitting layer 13 and the banks 15 (multiple protrusions) to cover all of the sub-pixels 100R, 100G, and 100B.

FIG. 23B illustrates an example of pixel banks, and each sub-pixel 100R, 100G, or 100B is separated by the banks 15. The bank 15 illustrated in FIG. 23B is formed such that the protrusions extending in parallel with the gate line 21 and the protrusions extending in parallel with the source line 22 cross each other. The sub-pixels 100R, 100G, and 100B are formed in the portions surrounded by the protrusions (that is, opening of the bank 15).

Each of the lower electrodes 12 is formed on the thin film semiconductor array device 20 (more specifically, on the upper interlayer insulating film 11) and in the opening of the bank 15 for each sub-pixel 100R, 100G, or 100B. The organic light emitting layer 13 is formed on the lower electrode 12 and in the opening of the bank 15 for each sub-pixel. The upper electrode 14 is continuously formed on the organic light-emitting layer 13 and the banks 15 (multiple protrusions) to cover all of the sub-pixels 100R, 100G, and 100B.

Furthermore, though not illustrated in FIGS. 23A and 23B, in the thin film semiconductor array device 20, the pixel circuits 30 are formed for the sub-pixels 100R, 100G, and 100B. Each of the sub-pixels 100R, 100G, and 100B and the corresponding one of the pixel circuit 30 are electrically connected.

Furthermore, the sub-pixels 100R, 100G, and 100B are identical except the property of the organic light-emitting layer 13 (color of luminescence).

The first source electrode 310S and the first drain electrode 310D may be switched in the embodiments. More specifically, in FIGS. 3 and 4, 310S is switched to the first drain electrode, and 310D is switched to the first source electrode. Similarly, the second drain electrode 320D and the second source electrode 320S may be switched in the embodiments. More specifically, in FIGS. 3 and 4, 320S is switched to the first drain electrode, and 320D is switched to the first source electrode.

In addition, in the embodiments, the first source electrode 310S is part of linear source line 22. However, it is not limited to this example. For example, when patterning the source line 22, the extended portion extending from part of the source line 22 in row direction may be patterned to electrically connect to the first source electrode 310S separately formed.

Similarly, in the embodiments, the second source electrode 320S is part of the linear first power supply line 23. However, it is not limited to this example. For example, when forming the pattern for the power supply line 23, an extended portion extending from part of the power supply line 23 in row direction may be patterned to electrically connect the extended portion and the second source electrode 320S which is separately formed.

In addition, in the embodiments, one power supply line 23 is provided for the adjacent gate lines 21. However, it is not limited to this example. For example, multiple power supply lines 23 may be arranged between the adjacent gate lines 21.

Furthermore, in the embodiments, two thin film transistors are formed for one pixel. However, it is not limited to this example. For example, three or more thin film transistors may be formed in one pixel. In this case, more than one power supply lines 23 may be arranged to match the number of the thin film transistors. With this, desirable power is supplied to thin film transistors which require power supply through more than one power supply lines 23.

Furthermore, in the embodiment, the organic EL display panel is illustrated as an example in the EL display panel according to the present invention. However, it is not limited to this example. For example, the EL display panel according to the present invention is applicable to a display including other display device in which active-matrix substrate is used. Inorganic EL panels and Liquid Crystal Display device (LCD) are examples of the display.

Furthermore, those skilled in the art will readily appreciate that many modifications are possible in the exemplary embodiments without materially departing from the novel teachings and advantages of this invention. For example, the EL display apparatus such as a thin flat television system 400 including an EL display panel 1 according to the present invention is included within the scope of the present invention.

INDUSTRIAL APPLICABILITY

The thin film semiconductor device for image display apparatus according to the present invention is useful as a driving backplane used for the organic EL display apparatus and the LCD apparatus.

What is claimed is:

1. A light-emitting panel, comprising:
    a substrate;
    a thin film semiconductor including a thin film transistor above the substrate, the thin film transistor including at least a gate electrode, a semiconductor layer above the gate electrode, a gate insulating film between the gate electrode and the semiconductor layer, a first electrode electrically connected to the semiconductor layer, and a second electrode;
    a first interlayer insulating film above the thin film semiconductor;
    a gate line above the first interlayer insulating film and electrically connected to the gate electrode;
    an auxiliary line above the first interlayer insulating film;
    a second interlayer insulating film above the gate line and the auxiliary line; and
    an electroluminescence emitter including two electrodes and a light-emitting layer between the two electrodes, one of the two electrodes being connected to the auxiliary line,
    wherein the gate line and the auxiliary line are between the first interlayer insulating film and the second interlayer insulating film.

2. The light-emitting panel according to claim 1,
    wherein each of the auxiliary line and the gate line has a lower surface in contact with the first interlayer insulating film.

3. The light-emitting panel according to claim 1,
    wherein the auxiliary line is side-by-side with the gate line.

4. The light-emitting panel according to claim 1, further comprising:
    a power supply line between the first interlayer insulating film and the second interlayer insulating film for supplying a driving current to the electroluminescence emitter.

5. The light-emitting panel according to claim 4,
    wherein each of the power supply line and the gate line has a lower surface in contact with the first interlayer insulating film.

6. The light-emitting panel according to claim 4,
    wherein the power supply line is side-by-side with the gate line.

7. The light-emitting panel according to claim 1,
    wherein the thin film semiconductor includes a plurality of thin film transistors, and
    the gate line is electrically connected to each of the plurality of thin film transistors via first conductive portions that pass through at least the first interlayer insulating film.

8. The light-emitting panel according to claim 7,
    wherein a power supply line is electrically connected to each of the plurality of thin film transistors via second conductive portions that pass through at least the first interlayer insulating film in positions different than the first conductive portions.

9. The light-emitting panel according to claim 1, further comprising:
    a source line electrically connected to one of the first electrode and the second electrode,
    wherein the source line is between the substrate and the first interlayer insulating film.

* * * * *